United States Patent
Nam

(10) Patent No.: US 12,158,497 B2
(45) Date of Patent: Dec. 3, 2024

(54) ELECTRONIC CIRCUIT PERFORMING ANALOG BUILT-IN SELF TEST AND OPERATING METHOD THEREOF

(71) Applicant: SAMSUNG ELECTRONICS CO., LTD., Suwon-si (KR)

(72) Inventor: Hyunseok Nam, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 295 days.

(21) Appl. No.: 17/959,545

(22) Filed: Oct. 4, 2022

(65) Prior Publication Data

US 2023/0137979 A1    May 4, 2023

(30) Foreign Application Priority Data

Nov. 2, 2021 (KR) .................. 10-2021-0149060

(51) Int. Cl.
  *G01R 31/317* (2006.01)
  *H03K 4/06* (2006.01)
  *H03K 19/20* (2006.01)

(52) U.S. Cl.
  CPC .... *G01R 31/31703* (2013.01); *G01R 31/31707* (2013.01); *G01R 31/31724* (2013.01); *H03K 4/06* (2013.01); *H03K 19/20* (2013.01)

(58) Field of Classification Search
  CPC ...... G01R 31/30; G01R 31/31; G01R 31/317; G01R 31/31703; G01R 31/31707; G01R 31/31724; G01R 31/3004; G01R 31/3167; G01R 31/3187; G01R 31/316; G01R 31/31728; G01R 31/318; G01R 31/318307; G01R 31/318314; H03K 4/06; H03K 19/20

See application file for complete search history.

(56) References Cited

U.S. PATENT DOCUMENTS

| | | |
|---|---|---|
| 5,132,685 A | 7/1992 | DeWitt et al. |
| 7,228,479 B2 | 6/2007 | Su et al. |
| 8,477,052 B2 | 7/2013 | Dey et al. |

(Continued)

FOREIGN PATENT DOCUMENTS

| | | | | |
|---|---|---|---|---|
| DE | 102009009486 B4 * | 6/2013 | .......... | H03M 1/1014 |
| JP | 2021-60328 A | 4/2021 | | |

(Continued)

*Primary Examiner* — Son T Le
(74) *Attorney, Agent, or Firm* — Sughrue Mion, PLLC

(57) ABSTRACT

An electronic circuit includes a ramp signal generator, an oscillator, a monitoring circuit and a logic controller. The ramp signal generator generates a ramp signal. The oscillator generates a clock signal. The monitoring circuit operates in an operation mode selected from a first mode of monitoring an external output voltage and a second mode of performing an analog built-in self-test (ABIST), and generates a comparator output. The logic controller controls the monitoring circuit to operate in the operation mode. When the monitoring circuit operates in the second mode, the logic controller counts the clock signal, controls the monitoring circuit to perform the ABIST based on the ramp signal, and generates an ABIST output indicating whether the monitoring circuit operates normally based on a value of the counting and the comparator output.

20 Claims, 28 Drawing Sheets

(56) References Cited

U.S. PATENT DOCUMENTS

| | | | |
|---|---|---|---|
| 2011/0137604 A1* | 6/2011 | Dasnurkar | H03M 1/109 |
| | | | 341/120 |
| 2017/0357829 A1* | 12/2017 | Park | G06F 21/86 |
| 2019/0072589 A1* | 3/2019 | Loh | G01R 19/155 |
| 2021/0172999 A1* | 6/2021 | Nam | G01R 31/2829 |
| 2023/0079000 A1* | 3/2023 | Corso Sarmiento | |
| | | | G01R 31/318552 |
| | | | 714/724 |

FOREIGN PATENT DOCUMENTS

| | | |
|---|---|---|
| KR | 10-2006-0094225 A | 8/2006 |
| KR | 10-0631872 B1 | 10/2006 |
| KR | 10-0834553 B1 | 6/2008 |

* cited by examiner

ELECTRONIC CIRCUIT PERFORMING ANALOG BUILT-IN SELF TEST AND OPERATING METHOD THEREOF

CROSS-REFERENCE TO RELATED APPLICATIONS

This application claims priority under 35 U.S.C. § 119 to Korean Patent Application No. 10-2021-0149060 filed on Nov. 2, 2021, in the Korean Intellectual Property Office, the disclosure of which is incorporated by reference herein in its entirety.

BACKGROUND

Embodiments of the present disclosure described herein relate to an electronic circuit performing an analog built-in self-test and an operating method thereof, and more particularly, relate to an electronic circuit performing an analog built-in self-test at low power, with high integration, and at high speed, and an operating method thereof.

An abnormal operation may occur in a semiconductor device due to an internal fault such as degradation of an element. A monitoring circuit may be added to the semiconductor device to monitor the abnormal operation. The monitoring circuit may detect whether various components present in the semiconductor device operate normally. An abnormal operation may also occur in the monitoring circuit. For this reason, a self-test circuit for the monitoring circuit may be added to monitor the abnormal operation of the monitoring circuit. In general, an analog built-in self-test (hereinafter referred to as an "ABIST") is performed on an analog circuit, and a logic built-in self-test (hereinafter referred to as an "LBIST") is performed on a digital circuit.

SUMMARY

It is an aspect to provide an electronic circuit performing an analog built-in self-test at low power, with high integration, and at high speed, and an operating method thereof According to an aspect of one or more embodiments, there may be provided an electronic circuit including a ramp signal generator configured to generate a first ramp signal; an oscillator configured to generate a clock signal; a first monitoring circuit configured to operate in an operation mode selected from a first mode of monitoring an external output voltage and a second mode of performing an analog built-in self-test (ABIST), and to generate a comparator output; and a logic controller configured to control the first monitoring circuit to operate in the operation mode, wherein, when the first monitoring circuit operates in the second mode, the logic controller counts the clock signal, controls the first monitoring circuit to perform the ABIST based on the first ramp signal, and generates an ABIST output indicating whether the first monitoring circuit operates normally based on a value of the counting and the comparator output.

According to another aspect of one or more embodiments, there may be provided an electronic circuit comprising a ramp signal generator configured to generate a first ramp signal, a second ramp signal, and a third ramp signal; a first monitoring circuit configured to operate in an operation mode selected from a first mode of monitoring an external output voltage and a second mode of performing an analog built-in self-test (ABIST); and an ABIST controller configured to perform the ABIST on the first monitoring circuit, based on the first ramp signal. The first monitoring circuit includes a sensor configured to detect the external output voltage; and a first comparator configured to generate a comparator output. The ABIST controller includes a second comparator configured to generate a first comparison voltage based on the second ramp signal; a third comparator configured to generate a second comparison voltage based on the third ramp signal; an AND gate configured to output a time window signal based on the first comparison voltage and the second comparison voltage; and a logic controller configured to control the first monitoring circuit to operate in the operation mode and, when the first monitoring circuit is controlled to operation in the second mode, to generate an ABIST output indicating whether the first monitoring circuit operates normally based on the time window signal and the comparator output of the first comparator.

According to yet another aspect of one or more embodiments, there may be provided an operating method of an electronic circuit, the method comprising receiving an analog built-in self-test (ABIST) enable signal; generating a selection signal based on the ABIST enable signal; generating at least one ramp signal based on the selection signal; generating a comparator output based on a reference voltage and the at least one ramp signal; determining whether a logical value of the comparator output transitions within a time window determined by the at least one ramp signal; generating an ABIST output indicating a normal operation of a monitoring circuit when the logical value of the comparator output transitions within the time window; and generating the ABIST output indicating an abnormal operation of the monitoring circuit when the logical value of the comparator output does not transition within the time window.

BRIEF DESCRIPTION OF THE FIGURES

The above and other aspects will become apparent by describing in detail embodiments thereof with reference to the accompanying drawings, in which.

DETAILED DESCRIPTION

In a case of generating an ABIST, a reference signal is generated based on an n-bit code having n bits, and whether the monitoring circuit operates normally is determined based on a result of comparing an output of the monitoring circuit based on the reference signal and a preset code. In this case, because "n" lines and a plurality of clock generating circuits are implemented in one chip, the degree of integration decreases, an area of the chip increases, and power consumption increases. Also, because the normal operation is determined based on a digital code, a resolution is limited depending on the number of bits to be used for determination. In addition, because the reference signal is generated based on a low pass filter, a speed at which the ABIST is performed becomes slow.

Below, embodiments will be described in detail and clearly to such an extent that one skilled in the art may easily carry out aspects of the present disclosure.

Figure 1:
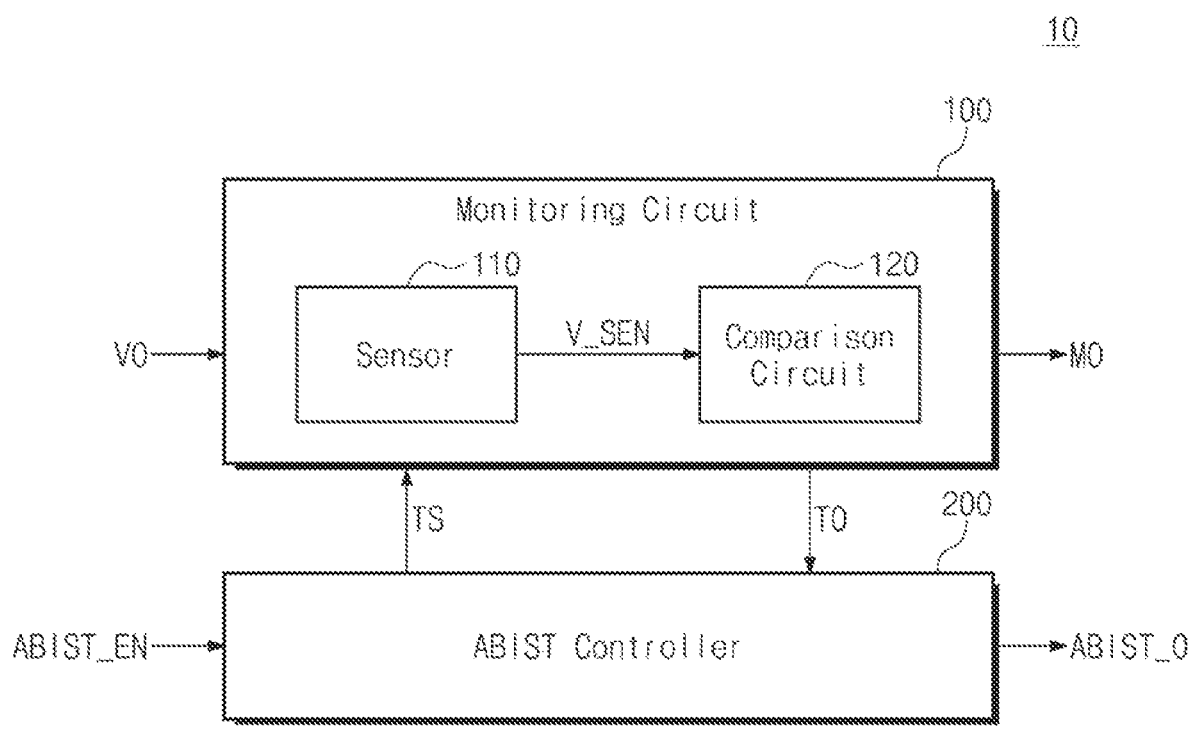
FIG. 1 is a conceptual diagram illustrating an electronic circuit according to an embodiment.

FIG. 1 is a conceptual diagram illustrating an electronic circuit according to an embodiment. An electronic circuit 10 may include a monitoring circuit 100, and analog built-in self-test (ABIST) controller 200. The electronic circuit 10 may perform the ABIST for internally determining whether the monitoring circuit 100 operates normally. For example, in the case where the monitoring circuit 100 does not operate normally due to an internal fault (e.g., a short circuit of an internal circuit, degradation of circuit elements, and/or an event that a comparator exceeds an operating range), the electronic circuit 10 may transfer, to an upper system, a fault signal (e.g., an ABIST output (ABIST_O)) indicating that a monitoring circuit does not operate normally.

The monitoring circuit 100 may include a sensor 110 and a comparison circuit 120. The monitoring circuit 100 may receive a test signal TS. The monitoring circuit 100 may operate in a first mode or a second mode based on the test signal TS. For example, the first mode may be a mode in which the ABIST is not performed, and the second mode may be a mode in which the ABIST is performed. For example, the test signal TS may include a signal indicating whether to perform the ABIST on the monitoring circuit 100, and/or a voltage signal used for the ABIST. For example, the voltage signal used for the ABIST may be a ramp signal, but the present disclosure is not limited thereto. In some embodiments, the voltage signal used for the ABIST may be in the form of a log or exponential function.

For example, in the case where the monitoring circuit 100 operates in the first mode (i.e., in which ABIST is not performed), the monitoring circuit 100 may receive an output signal (e.g., an external output voltage VO) from an external control unit (e.g., a power management integrated circuit (PMIC), a micro controller unit (MCU), a communication processor (CP), and/or an application processor (AP), etc.). The monitoring circuit 100 may determine whether the external control unit operates normally, based on the received output signal. The monitoring circuit 100 may transfer information about whether the external control unit operates normally, to the upper system.

In contrast, in the case where the monitoring circuit 100 operates in the second mode (i.e., in which ABIST is performed), the monitoring circuit 100 may transfer a test output TO to the ABIST controller 200 for the purpose of internally determining whether the monitoring circuit 100 operates normally. According to an embodiment, the monitoring circuit 100 may generate the test output TO based on a separate voltage source and/or a separate current source for the ABIST.

The sensor 110 may output a sensing voltage V_SEN. For example, the sensor 110 may include a voltage division circuit. In this case, a voltage division ratio of the sensor 110 may be variable depending on a request of a user or settings of a manufacturer. In the case where the monitoring circuit 100 operates in the first mode (i.e., in which ABIST is not performed), the sensor 110 may receive the external output voltage VO to output the sensing voltage V_SEN and may output the sensing voltage V_SEN. In the case where the monitoring circuit 100 operates in the second mode (i.e., in which ABIST is performed), the sensor 110 may output the sensing voltage V_SEN based on a voltage or current for the ABIST. A configuration, a function, and an operation of the sensor 110 will be described in more detail with reference to FIGS. 2A and 2B.

The comparison circuit 120 may receive the sensing voltage V_SEN. In the case where the monitoring circuit 100 operates in the first mode (i.e., in which ABIST is not performed), the comparison circuit 120 may transfer a monitoring output MO to the upper system as a result of comparing the sensing voltage V_SEN and a reference voltage. In the case where the monitoring circuit 100 operates in the second mode (i.e., in which ABIST is performed), the comparison circuit 120 may output a result of comparing the sensing voltage V_SEN and a ramp signal (i.e., the test output TO) to the ABIST controller 200. A configuration, a function, and an operation of the comparison circuit 120 will be described in more detail with reference to FIGS. 2A and 2B.

The ABIST controller 200 may operate in response to an ABIST enable signal ABIST_EN. When the ABIST enable signal ABIST_EN is input to the ABIST controller 200 (e.g., a high enable is input thereto), the ABIST controller 200 may transfer the test signal TS to the monitoring circuit 100 such that the monitoring circuit 100 operates in the second mode (i.e., in which ABIST is performed). In the case where the monitoring circuit 100 transfers the test output TO to the ABIST controller 200 in response to the test signal TS, the ABIST controller 200 may transfer the ABIST output ABIST_O based on the test output TO to the upper system. For example, the ABIST output ABIST_O may include information about whether the monitoring circuit 100 operates normally. A configuration, a function, and an operation of the ABIST controller 200 will be described in more detail with reference to FIG. 3.

Figure 2A:
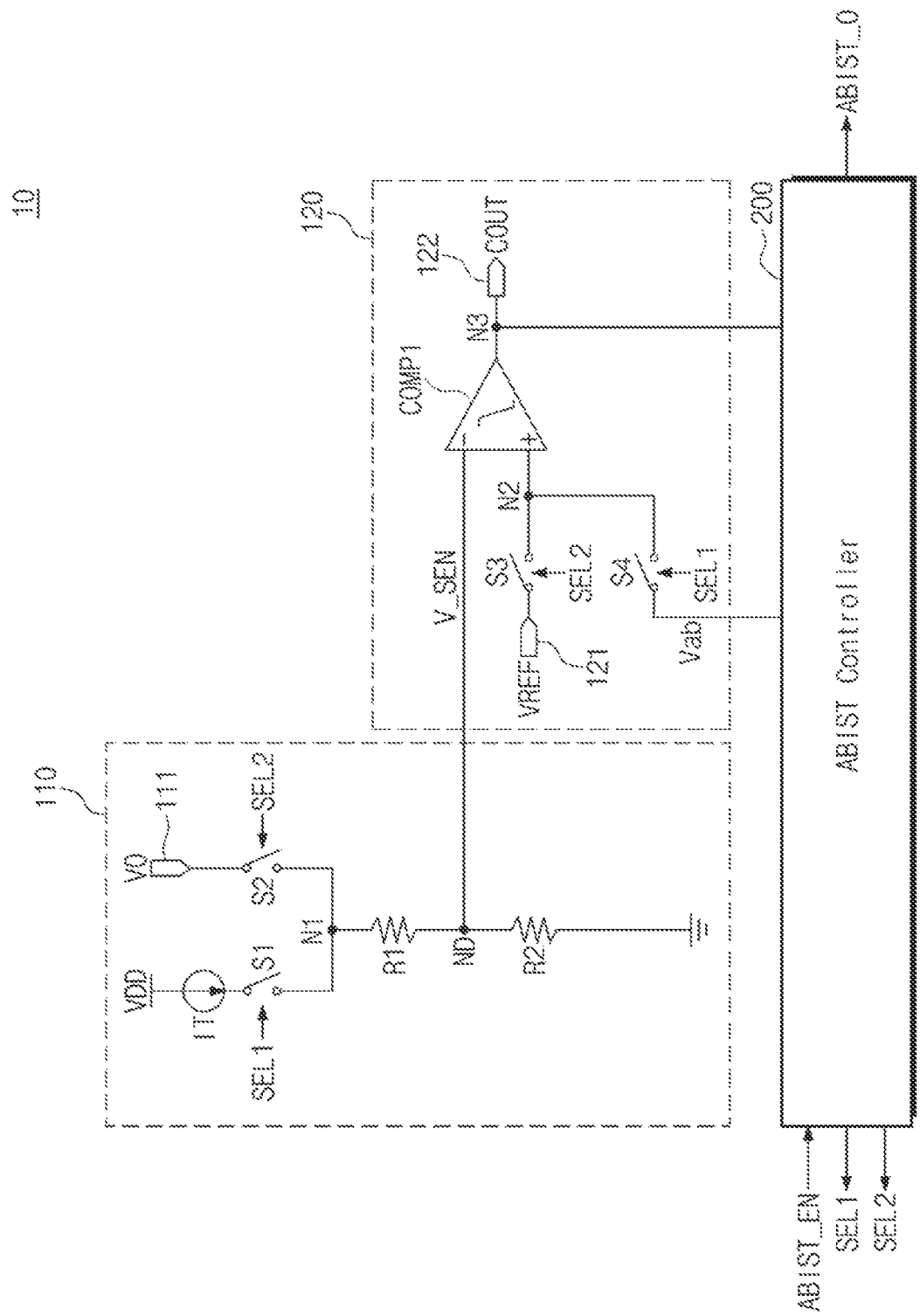
FIGS. 2A and 2B are circuit diagrams illustrating configurations of a sensor and a comparison circuit of a monitoring circuit, according to various embodiments.
Figure 2B:
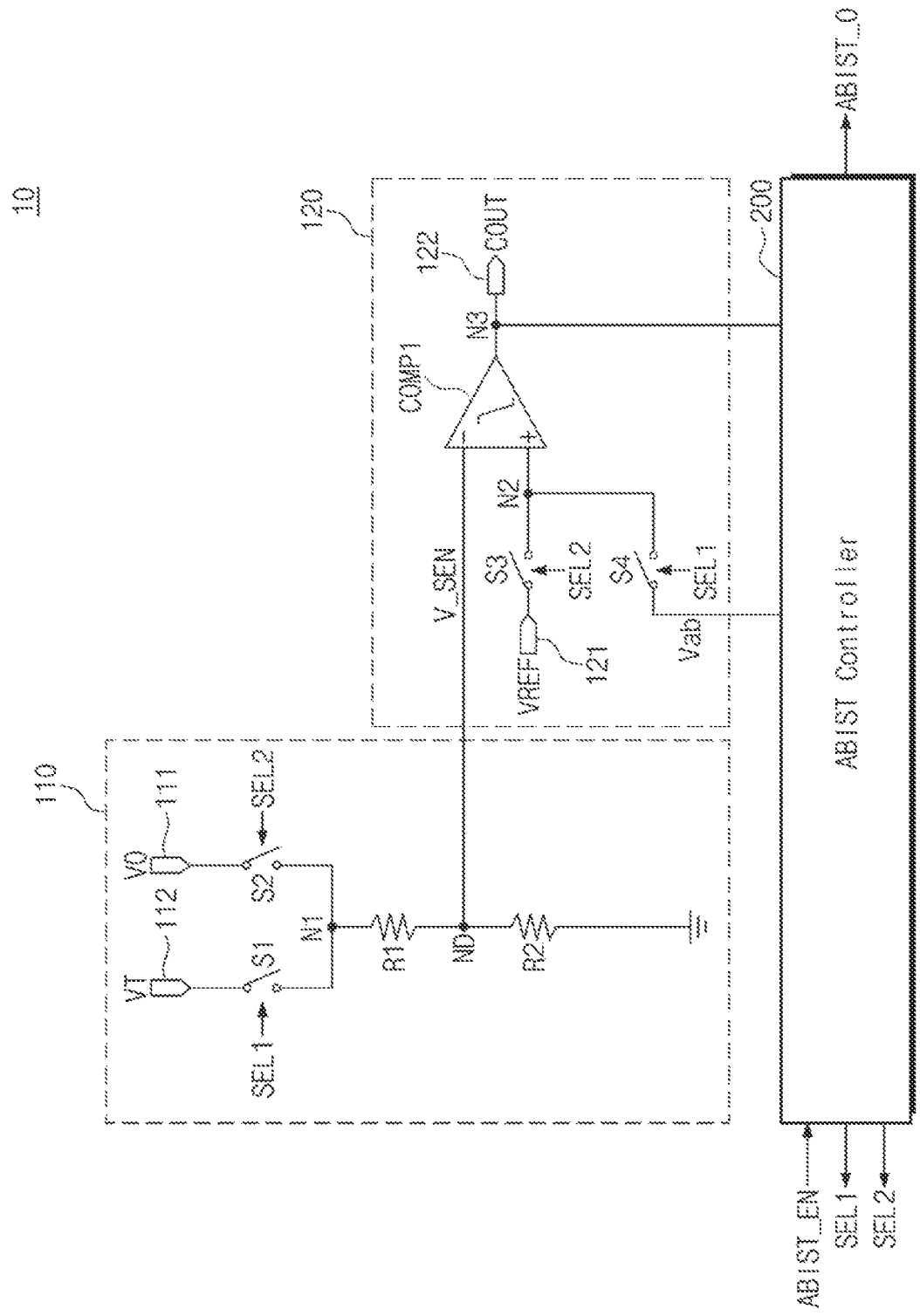

FIGS. 2A and 2B are circuit diagrams illustrating configurations of a sensor and a comparison circuit of a monitoring circuit, according to various embodiments. Like reference numbers are used to refer to like components and a repeated description given with reference to FIG. 1 will be omitted for conciseness and to avoid redundancy. Referring to FIGS. 1, 2A, and 2B, the ABIST controller 200 may output a first selection signal SEL1 and a second selection signal SEL2 in response to the ABIST enable signal ABIST_EN. The first selection signal SEL1 and the second selection signal SEL2 may control the monitoring circuit 100 to operate in one mode from among the first mode and the second mode. For example, the first selection signal SEL1 may be a selection signal allowing the monitoring circuit 100 to perform the ABIST (i.e., to operate in the second mode), and the second selection signal SEL2 may be a selection signal allowing the monitoring circuit 100 not to perform the ABIST (i.e., to operate in the first mode). The first selection signal SEL1 and the second selection signal SEL2 may have complementary logic levels. In an embodiment, when the ABIST enable signal ABIST_EN is at logic high, the first selection signal SEL1 may be at logic high, and the second selection signal SEL2 may be at logic low. In this case, the monitoring circuit 100 may operate in the second mode.

An example in which the ABIST controller 200 outputs the first selection signal SEL1 and the second selection signal SEL2 independently of each other is illustrated, but the present disclosure is not limited thereto. For example, in some embodiments, the ABIST controller 200 may output only one selection signal; in this case, the electronic circuit 10 may include at least one logic element (e.g., an inverter) for inverting the selection signal.

Referring to FIGS. 1 and 2A, the sensor 110 may include a test current bias IT, an external voltage input pin 111, a first switch S1, a second switch S2, a first resistor R1, and a second resistor R2.

The test current bias IT may be connected between a power supply voltage (VDD) terminal and a first end of the first switch S1. The test current bias IT may provide a current for the ABIST based on the power supply voltage VDD. The first switch S1 may be connected between the test current bias IT and a first node N1. The first switch S1 may be turned on or off in response to the first selection signal SEL1.

The external voltage input pin 111 may be connected with a first end of the second switch S2. The external voltage input pin 111 may receive the external output voltage VO so as to be transferred to the sensor 110. The second switch S2 may be connected between the external voltage input pin 111 and the first node N1. The second switch S2 may be turned on or off in response to the second selection signal SEL2.

The first resistor R1 may be connected between the first node N1 and a voltage division node ND. The second resistor R2 may be connected between the voltage division node ND and a ground voltage terminal. A voltage of the first node N1 may be divided by the first resistor R1 and the second resistor R2, and the sensor 110 may transfer a voltage (i.e., the sensing voltage V_SEN) of the voltage division node ND to the comparison circuit 120.

The first switch S1 may be turned on when the first selection signal SEL1 is at logic high and may be turned off when the first selection signal SEL1 is at logic low. As in the above description, the second switch S2 may be turned on when the second selection signal SEL2 is at logic high and may be turned off when the second selection signal SEL2 is at logic low. However, the present disclosure is not limited thereto. For example, a relationship between an on/off of a switch and a logic level of a selection signal may be opposite to the above relationship. For convenience of description, the description will be given under the assumption that the first switch S1 is turned on the first selection signal SEL1 is at logic high and the second switch S2 is turned on the second selection signal SEL2 is at logic high.

When the first selection signal SEL1 is at logic low, the second selection signal SEL2 may be at logic high. In this case, the first switch S1 may be turned off, and the second switch S2 may be turned on. Accordingly, a voltage level of the first node N1 may be a level of the external output voltage VO. The level of the external output voltage VO may be stepped down to a level of the sensing voltage V_SEN through the voltage division node ND.

In contrast, when the first selection signal SEL1 is at logic high, the second selection signal SEL2 may be at logic low. In this case, the first switch S1 may be turned on, and the second switch S2 may be turned off. Accordingly, a uniform current may flow to the first node N1 through the test current bias IT. The level of the power supply voltage VDD may be stepped down to the level of the sensing voltage V_SEN through the voltage division node ND.

The comparison circuit 120 may include a first comparator COMP1, a reference voltage input pin 121, a comparator output pin 122, a third switch S3, and a fourth switch S4.

A negative input terminal of the first comparator COMP1 may be connected with the voltage division node ND, and thus, the sensing voltage V_SEN may be input to the negative input terminal. A positive input terminal of the first comparator COMP1 may be connected with a second node N2. Thus, a reference voltage VREF or a first ramp signal Vab may be input to the positive input terminal. An output terminal of the first comparator COMP1 may be connected with a third node N3, and thus, a comparator output COUT may be output from the output terminal. Although not illustrated, in some embodiments, the first comparator COMP1 may further include a positive power terminal and a negative power terminal, and separate bias voltages may be respectively applied to the positive power terminal and the negative power terminal.

The reference voltage input pin 121 may be connected with a first end of the third switch S3. The reference voltage input pin 121 may receive the reference voltage VREF so as to be transferred to the comparison circuit 120. The third switch S3 may be connected between the reference voltage input pin 121 and the second node N2. The third switch S3 may be turned on or off in response to the second selection signal SEL2. The fourth switch S4 may be connected between the ABIST controller 200 and the second node N2. The fourth switch S4 may be turned on or off in response to the first selection signal SEL1. A relationship between the third and fourth switches S3 and S4 and the first and second selection signals SEL1 and SEL2 is similar to the relationship between the first and second switches S1 and S2 and the first and second selection signals SEL1 and SEL2, and thus, additional description will be omitted for conciseness and to avoid redundancy.

When the first selection signal SEL1 is at logic low, the second selection signal SEL2 may be at logic high. In this case, the third switch S3 may be turned on, and the fourth switch S4 may be turned off. Accordingly, the reference voltage VREF may be applied to the positive input terminal of the first comparator COMP1. The first comparator COMP1 may compare the sensing voltage V_SEN and the reference voltage VREF to output the comparator output COUT. The comparator output COUT may be transferred to the upper system through the comparator output pin 122.

In contrast, when the first selection signal SEL1 is at logic high, the second selection signal SEL2 may be at logic low. In this case, the third switch S3 may be turned off, and the fourth switch S4 may be turned on. Accordingly, the first ramp signal Vab may be applied to the positive input terminal of the first comparator COMP1. The first comparator COMP1 may compare the sensing voltage V_SEN and the first ramp signal Vab to output the comparator output COUT. The comparator output COUT may be transferred to the ABIST controller 200. In some embodiments, a switch may be connected between the third node N3 and the ABIST controller 200 and may be turned on or off in response to the first selection signal SEL1, and additionally or alternatively, a switch may be connected between the third node N3 and the comparator output pin 122 and may be turned on or off in response to the second selection signal SEL2.

Referring to FIGS. 1 and 2B, the sensor 110 according to an embodiment may include the external voltage input pin 111, a test voltage input pin 112, the first switch S1, the second switch S2, the first resistor R1, and the second resistor R2. That is, in the case where the monitoring circuit 100 operates in the second mode, the sensor 110 may be separately provided with a reference voltage for test (i.e., a test voltage VT) from the outside. The configurations, functions, and operations of the comparison circuit 120, the ABIST controller 200, the external voltage input pin 111, the second switch S2, the first resistor R1, and the second resistor R2 are similar to those of FIG. 2A, and thus, repeated description thereof will be omitted for conciseness and to avoid redundancy.

The test voltage input pin 112 may be connected with the first end of the first switch S1. The test voltage input pin 112 may receive the test voltage VT so as to be transferred to the sensor 110. For example, in some embodiments, the test voltage VT may have an arbitrary or preset voltage level. The first switch S1 may be connected between the test voltage input pin 112 and the first node N1. The first switch S1 may be turned on or off in response to the first selection signal SEL1.

For example, when the first selection signal SEL1 is at logic high, the second selection signal SEL2 may be at logic low. In this case, the first switch S1 may be turned on, and the second switch S2 may be turned off. Accordingly, the voltage level of the first node N1 may be the level of the test voltage VT. The level of the test voltage VT may be stepped down to the level of the sensing voltage V_SEN through the voltage division node ND.

Figure 3:
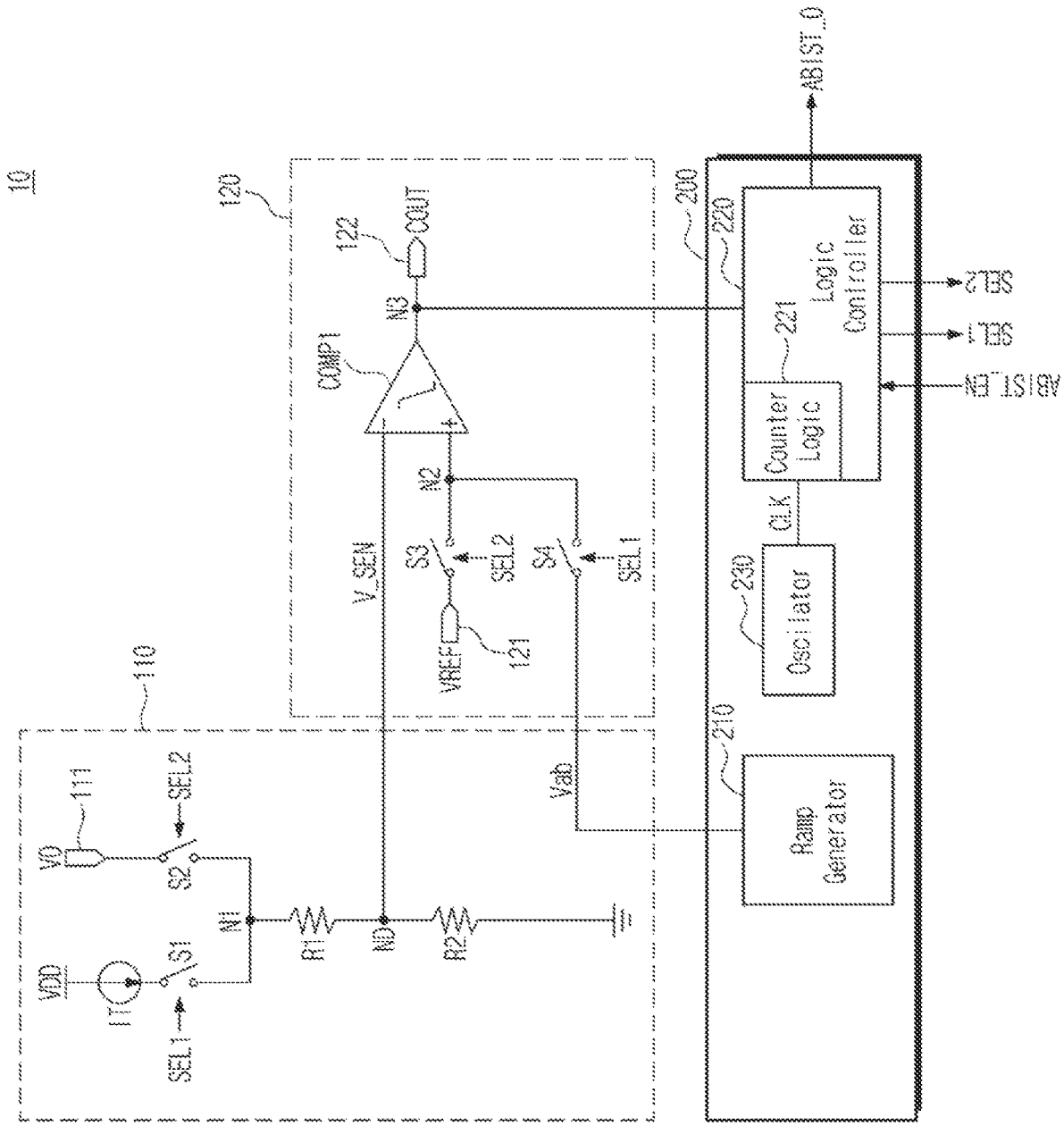
FIG. 3 is a circuit diagram illustrating a configuration and an operation of an ABIST controller of FIGS. 1 to 2B, according to an embodiment.

FIG. 3 is a circuit diagram illustrating a configuration and an operation of an ABIST controller of FIGS. 1 to 2B, according to an embodiment. An example in which the sensor 110 corresponds to the sensor 110 of FIG. 2A is illustrated. The ABIST controller 200 may include a ramp signal generator 210, a logic controller 220, and an oscillator 230. Repeated description to the description given with reference to FIGS. 1 to 2B will be omitted for conciseness and to avoid redundancy.

The ramp signal generator 210 may generate the first ramp signal Vab. For example, the ramp signal generator 210 may generate the first ramp signal Vab based on at least one voltage bias. Herein, according to various embodiments, the voltage bias may be input from the inside the ramp signal generator 210 (i.e., the voltage bias may be generated by the ramp signal generator 210) or the voltage bias may be input from outside of the ramp signal generator 210 (i.e., the voltage bias may be generated externally to the ramp signal generator 210). For example, the first ramp signal Vab may be a rising ramp signal, but the present disclosure is not limited thereto. For example, the first ramp signal Vab may be a falling ramp signal or an alternating ramp signal. The ramp signal generator 210 may generate (or receive) the first ramp signal Vab whose characteristics (e.g., an initial voltage level and a slope) vary depending on a request of the user or settings of the manufacturer. A configuration and an operation of the ramp signal generator 210 will be described with reference to FIG. 4.

The logic controller 220 may control the ABIST operation in response to the ABIST enable signal ABIST_EN. The logic controller 220 may generate the first and second selection signals SEL1 and SEL2 based on a logical value of the ABIST enable signal ABIST_EN.

The logic controller 220 may include counter logic 221. For example, according to various embodiments, the counter logic 221 may operate in a synchronous or asynchronous manner. The counter logic 221 may count a clock signal CLK every clock period, based on the clock signal CLK from the oscillator 230. In detail, the counter logic 221 may increase or decrease a counting value every rising edge and/or every falling edge of the clock signal CLK. According to an embodiment, the counter logic 221 may increase the counting value based on the rising edge of the clock signal CLK. Herein, the counting value that is a value obtained by counting the clock signal CLK every clock period may correspond to a specific point in time. Although not illustrated, the counting value may be stored in a register or memory that is provided inside or outside the logic controller 220. The counter logic 221 may output a binary code corresponding to the counting value.

The logic controller 220 may determine whether the comparator output COUT is output within a normal range, based on a time window as a reference for ABIST performance. Herein, the time window may indicate a time range between two points in time corresponding to binary codes and may be an arbitrary value or may be a given value. For example, in some embodiments, the time window may be a preset value. For example, in some embodiments, the time window may be set based on a slope of first ramp signal Vab. According to an embodiment, the logic controller 220 may generate the ABIST output ABIST_O based on a logic level of the comparator output COUT within the time window. In an embodiment, in the case where the logical value of the comparator output COUT changes (or a rising transition of the comparator output COUT occurs) within the time window, the logic controller 220 may generate the ABIST output ABIST_O indicating the normal operation of the monitoring circuit 100. In contrast, in the case where the logical value of the comparator output COUT does not change (or the rising transition of the comparator output COUT does not occur) within the time window, the logic controller 220 may generate the ABIST output ABIST_O indicating the abnormal operation of the monitoring circuit 100.

The oscillator 230 may generate the clock signal CLK in response to the ABIST enable signal ABIST_EN. The period of the clock signal CLK may be determined arbitrarily or in advance, and may change depending on a request of the user and/or depending on settings of the manufacturer. For example, when a logical value of the ABIST enable signal ABIST_EN is logic high, the oscillator 230 may generate the clock signal CLK. In contrast, when the logical value of the ABIST enable signal ABIST_EN is logic low, the oscillator 230 may not generate the clock signal CLK. An example in which the oscillator 230 is provided in the ABIST controller 200 is illustrated in FIG. 3. However, unlike the example of FIG. 3, in some embodiments, the oscillator 230 may be provided outside the ABIST controller 200.

Figure 4:
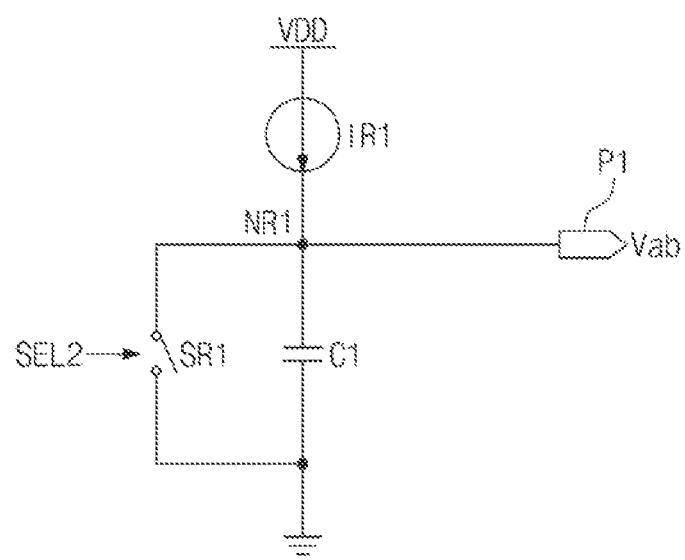
FIG. 4 is a circuit diagram illustrating a configuration and an operation of a ramp signal generator of FIG. 3, according to an embodiment.

FIG. 4 is a circuit diagram illustrating a configuration and an operation of the ramp signal generator of FIG. 3, according to an embodiment. Referring to FIGS. 1, 3, and 4, the ramp signal generator 210 may include a first ramp current bias IR1, a first capacitor C1, a first ramp switch SR1, and a first ramp signal output pin P1. The first ramp current bias IR1 may be connected between the power supply voltage (VDD) terminal and a first ramp node NR1. The first ramp current bias IR1 may provide a current for the first ramp signal Vab based on the power supply voltage VDD. A current level of the first ramp current bias IR1 may change depending on a request of the user and/or depending on settings of the manufacturer. The first ramp switch SR1 may be connected between the first ramp node NR1 and the ground voltage terminal. The first ramp switch SR1 may be turned on or off in response to the second selection signal SEL2. The first capacitor C1 may be connected between the first ramp node NR1 and the ground voltage terminal. A capacitance of the first capacitor C1 may change depending on a request of the user and/or depending on settings of the manufacturer.

For example, when the second selection signal SEL2 is at logic low, the first ramp switch SR1 may be turned off, and thus, charges may be charged in the first capacitor C1 by the first ramp current bias IR1. In this case, because the first ramp current bias IR1 supplies a uniform current, a level of a voltage (i.e., the first ramp signal Vab) of the first ramp node NR1 may increase with a uniform slope. In contrast, when the second selection signal SEL2 is at logic high, the first ramp switch SR1 may be turned on, and thus, the charges in the first capacitor C1 may be discharged. Accordingly, the first ramp signal Vab may be a signal of a triangular waveform to which there is applied a characteristic of the first capacitor C1 that is charged or discharged over time. The slope of the first ramp signal Vab may be changed depending on the current level of the first ramp current bias IR1 and the capacitance of the first capacitor C1. The first ramp signal Vab may be transferred to the monitoring circuit 100 through the first ramp signal output pin P1.

Figure 5A:
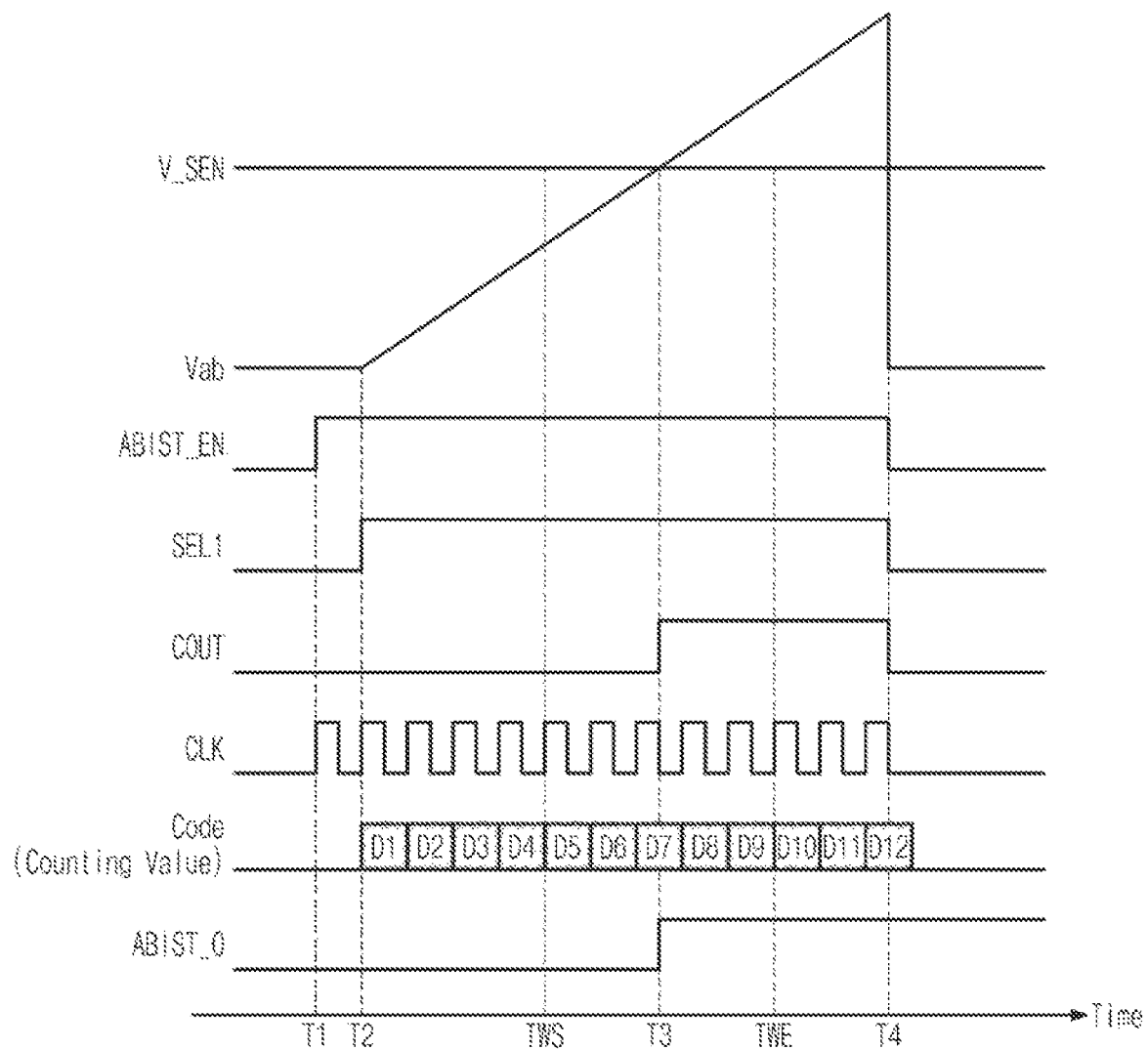
FIG. 5A is a timing diagram illustrating an operation of an ABIST controller in a normal operation of a monitoring circuit of FIG. 3, and FIGS. 5B and 5C are timing diagrams illustrating an operation of an ABIST controller in an abnormal operation of the monitoring circuit of FIG. 3.

FIG. 5A is a timing diagram illustrating an operation of an ABIST controller in a normal operation of the monitoring circuit 100 of FIG. 3. Referring to FIGS. 3 and 5A, the ABIST controller 200 may perform the ABIST on the monitoring circuit 100 in response to the ABIST enable signal ABIST_EN. In an embodiment, based on a time window from point in time TWS to point in time TWE, the ABIST controller 200 may generate the ABIST output ABIST_O indicating whether the monitoring circuit 100 operates normally. For example, in the case where a logical value of the comparator output COUT changes (e.g., from logic low to logic high) within the time window, it may be determined that the monitoring circuit 100 is operating normally.

At point in time T1, the ABIST enable signal ABIST_EN of logic high may be input to the ABIST controller 200. The oscillator 230 may generate the clock signal CLK of a given period in response to the ABIST enable signal ABIST_EN or a signal corresponding to the ABIST enable signal ABIST_EN. The clock signal CLK may be transferred to the logic controller 220.

At point in time T2, the first selection signal SEL1 may transition to logic high in response to the ABIST enable signal ABIST_EN of logic high. As the first selection signal SEL1 is set to logic high, the monitoring circuit 100 may operate in the second mode, and the ramp signal generator 210 may generate the first ramp signal Vab. Accordingly, the comparison circuit 120 may compare a level of the first ramp signal Vab and a level of the sensing voltage V_SEN. Because the level of the first ramp signal Vab is lower than the level of the sensing voltage V_SEN from point in time T2 to point in time TWS, the comparison circuit 120 may generate the comparator output COUT of logic low. The counter logic 221 may count the clock signal CLK based on the rising edge of the clock signal CLK. As a result, the counter logic 221 may generate binary codes D1 to D12 corresponding to counting values from point in time T2 to point in time T4. Specific binary codes D5 to D9 may correspond to points in time within the time window.

At point in time T3, the level of the first ramp signal Vab may be equal to the level of the sensing voltage V_SEN. Because the level of the first ramp signal Vab is higher than or equal to the level of the sensing voltage V_SEN, the comparison circuit 120 may generate the comparator output COUT of logic high. Accordingly, the comparator output COUT may transition from logic low to logic high at point in time T3. Because the point in time T3 is a point in time (i.e., corresponding to the binary code D7) within the time window, the ABIST controller 200 may generate the ABIST output ABIST_O indicating that the monitoring circuit 100 is operating normally. For example, in some embodiments, the ABIST controller 200 may generate the ABIST output ABIST_O of logic high to indicate that the monitoring circuit 100 is operating normally. In other embodiments, the ABIST controller 200 may generate the ABIST output ABIST_O that pulses to logic high to indicate that the monitoring circuit 100 is operating normally.

At point in time T4, the ABIST enable signal ABIST_EN of logic low may be input to the ABIST controller 200. The first selection signal SEL1 may transition to logic low at a falling edge of the ABIST enable signal ABIST_EN. The oscillator 230 may not generate (i.e., stop generating) the clock signal CLK in response to the ABIST enable signal ABIST_EN or the signal corresponding to the ABIST enable signal ABIST_EN. The counter logic 221 may reset the counting value without counting the clock signal CLK.

Figure 5B:
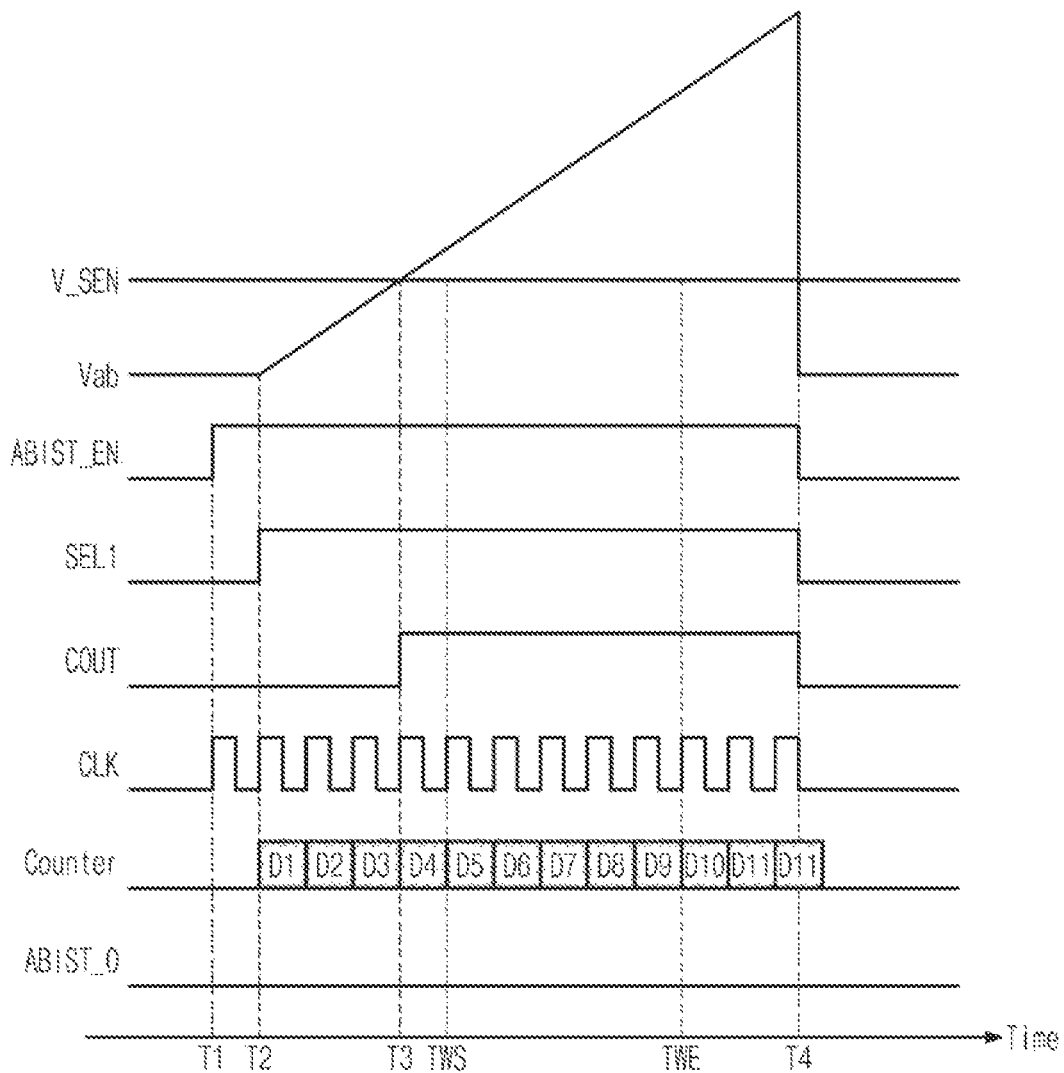
Figure 5C:
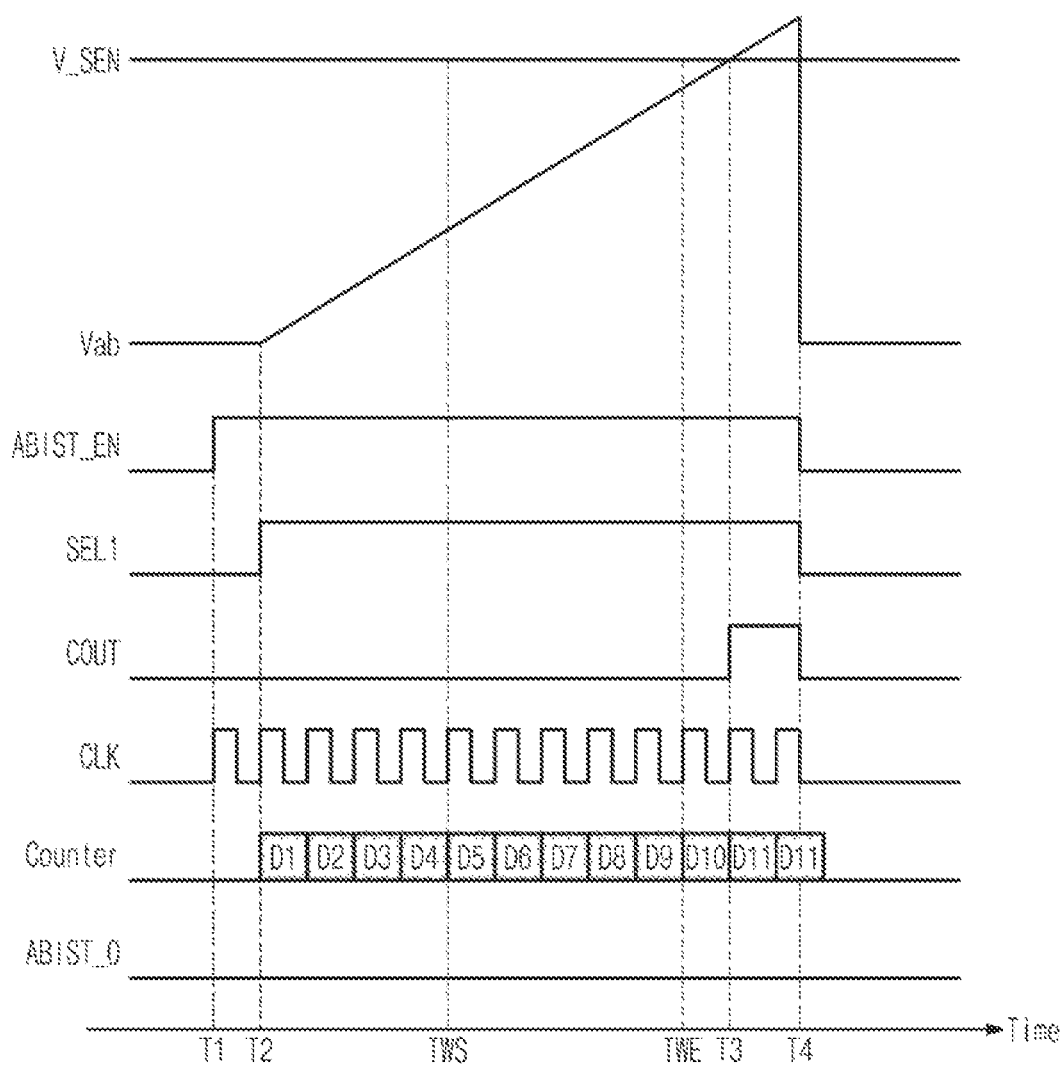

FIGS. 5B and 5C are timing diagrams illustrating an operation of an ABIST controller in an abnormal operation of the monitoring circuit 100 of FIG. 3. Repeated description as the description given with reference to FIG. 5A will be omitted for conciseness and to avoid redundancy. Referring to FIGS. 3 and 5B, a level of the sensing voltage V_SEN may decrease due to an internal fault of the monitoring circuit 100. Accordingly, a point in time when the comparator output COUT transitions from logic low to logic high may lead a normal range (i.e., a time window). In other words, the point of time when the comparator output COUT transitions from logic low to logic high may occur before the time window for determining the normal operation begins/opens.

At point in time T3, the comparator output COUT may transition from logic low to logic high. Because the point in time T3 is a point in time (i.e., the binary code D4) before the time window begins/opens, the ABIST controller 200 may generate the ABIST output ABIST_O indicating that the monitoring circuit 100 is operating abnormally. For example, the ABIST output ABIST_O may be logic low.

Referring to FIGS. 3 and 5C, a level of the sensing voltage V_SEN may increase due to an internal fault of the monitoring circuit 100. Accordingly, a point in time when the comparator output COUT transitions from logic low to logic high may lag behind a normal range (i.e., a time window). In other words, the point of time when the comparator output COUT transitions from logic low to logic high may occur after the time window for determining the normal operation ends/closes.

At point in time T3, the comparator output COUT may transition from logic low to logic high. Because the point in time T3 is a point in time (i.e., the binary code D10) after the time window ends/closes, the ABIST controller 200 may generate the ABIST output ABIST_O indicating that the monitoring circuit 100 is operating abnormally.

The timing diagrams illustrated in FIGS. 5A to 5C are provided as an example, the described points in time T1 to T6 are example points in time, and a time period between points in time may change depending on embodiments.

Figure 6:
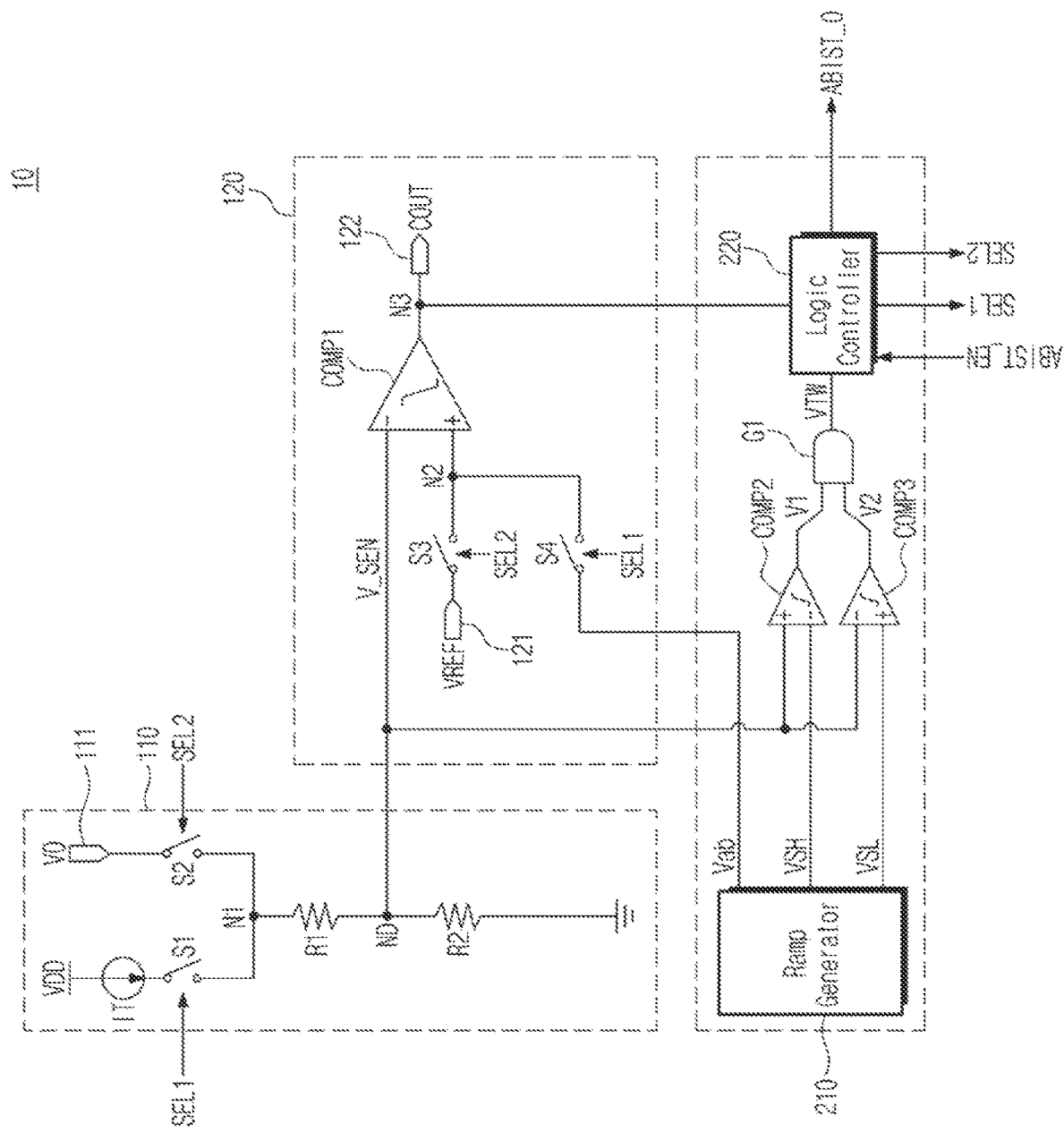
FIG. 6 is a circuit diagram illustrating a configuration and an operation of an ABIST controller of FIGS. 1 to 2B, according to an embodiment.

FIG. 6 is a circuit diagram illustrating a configuration and an operation of an ABIST controller of FIGS. 1 to 2B, according to an embodiment. An example in which the sensor 110 corresponds to the sensor 110 of FIG. 2A is illustrated. The ABIST controller 200 may include the ramp signal generator 210, the logic controller 220, a second comparator COMP2, a third comparator COMP3, and an AND gate G1. Repeated description to the description given with reference to FIGS. 1 to 2B will be omitted for conciseness and to avoid redundancy.

The ramp signal generator 210 may generate the first ramp signal Vab, a second ramp signal VSH, and a third ramp signal VSL. The ramp signal generator 210 may generate the first to third ramp signals Vab, VSH, and VSL based on at least one voltage bias. Herein, the voltage bias may be input from the inside or outside of the ramp signal generator 210.

The ramp signal generator 210 may generate the first to third ramp signals Vab, VSH, and VSL whose characteristics (e.g., an initial voltage level and a slope) vary depending on a request of the user and/or depending on settings of the manufacturer. For example, the first ramp signal Vab may be a rising ramp signal, and the second and third ramp signals VSH and VSL may be falling ramp signals. Accordingly, the first ramp signal Vab may have a positive slope value, and the second and third ramp signals VSH and VSL may have negative slope values. In this case, an absolute value of the slope of the second ramp signal VSH may be greater than an absolute value of the slope of the third ramp signal VSL. A time window may change depending on arbitrary slopes or depending on preset slopes of the second and third ramp signals VSH and VSL. A configuration and an operation of the ramp signal generator 210 will be described with reference to FIG. 7.

A positive input terminal of the second comparator COMP2 may be connected with the voltage division node ND, and thus, the sensing voltage V_SEN may be input to the positive input terminal. A negative input terminal of the second comparator COMP2 may be connected with the ramp signal generator 210, and the second ramp signal VSH may be input to the negative input terminal. An output terminal of the second comparator COMP2 may be connected with a first input terminal of the AND gate G1, and a first comparison voltage V1 may be output from the output terminal of the second comparator COMP2 to the AND gate G1.

The second comparator COMP2 may output the first comparison voltage V1 as a result of comparing the sensing voltage V_SEN and the second ramp signal VSH. For example, when a level of the second ramp signal VSH is greater than a level of the sensing voltage V_SEN, the first comparison voltage V1 may be set to logic low. In contrast, when the level of the second ramp signal VSH is smaller than or equal to the level of the sensing voltage V_SEN, the first comparison voltage V1 may be set to logic high.

A negative input terminal of the third comparator COMP3 may be connected with the voltage division node ND, and thus, the sensing voltage V_SEN may be input to the negative input terminal. A positive input terminal of the third comparator COMP3 may be connected with the ramp signal generator 210, and the third ramp signal VSL may be input to the positive input terminal. An output terminal of the third comparator COMP3 may be connected with a second input terminal of the AND gate G1, and a second comparison voltage V2 may be output from the output terminal of the third comparator COMP3 to the AND gate G1.

The third comparator COMP3 may output the second comparison voltage V2 as a result of comparing the sensing voltage V_SEN and the third ramp signal VSL. For example, when a level of the third ramp signal VSL is greater than the level of the sensing voltage V_SEN, the second comparison voltage V2 may be set to logic low. In contrast, when the level of the third ramp signal VSL is smaller than or equal to the level of the sensing voltage V_SEN, the second comparison voltage V2 may be set to logic high.

Although not illustrated, in some embodiments, each of the second and third comparators COMP2 and COMP3 may further include a positive power terminal and a negative power terminal, and separate bias voltages may be respectively applied to the positive power terminal and the negative power terminal.

The AND gate G1 may include the first input terminal, the second input terminal, and an output terminal. The first input terminal of the AND gate G1 may be connected with the second comparator COMP2. The second input terminal of the AND gate G1 may be connected with the third comparator COMP3. The output terminal of the AND gate G1 may be connected with the logic controller 220. The AND gate G1 may receive the first comparison voltage V1 and the second comparison voltage V2 to output a time window signal VTW. When both the first comparison voltage V1 and the second comparison voltage V2 are at logic high, the time window signal VTW may be set to logic high.

The logic controller 220 may control the ABIST operation in response to the ABIST enable signal ABIST_EN. The logic controller 220 may generate the first and second selection signals SEL1 and SEL2 based on a logical value of the ABIST enable signal ABIST_EN. An example of a relationship between the ABIST enable signal ABIST_EN and the first and second selection signals SEL1 and SEL2 will be described with reference to FIGS. 8A to 10B. A configuration and an operation of the logic controller 220 will be described with reference to FIG. 11.

According to an embodiment, when the ABIST enable signal ABIST_EN of logic high is received, the logic controller 220 may perform the ABIST on the monitoring circuit 100. The logic controller 220 may generate the ABIST output ABIST_O indicating whether a logical value of the comparator output COUT changes (e.g., transitions to logic high) within a time window (e.g., a logical high period of the time window signal VTW). A configuration and an operation of the logic controller 220 will be described in detail with reference to FIG. 9.

Figure 7:
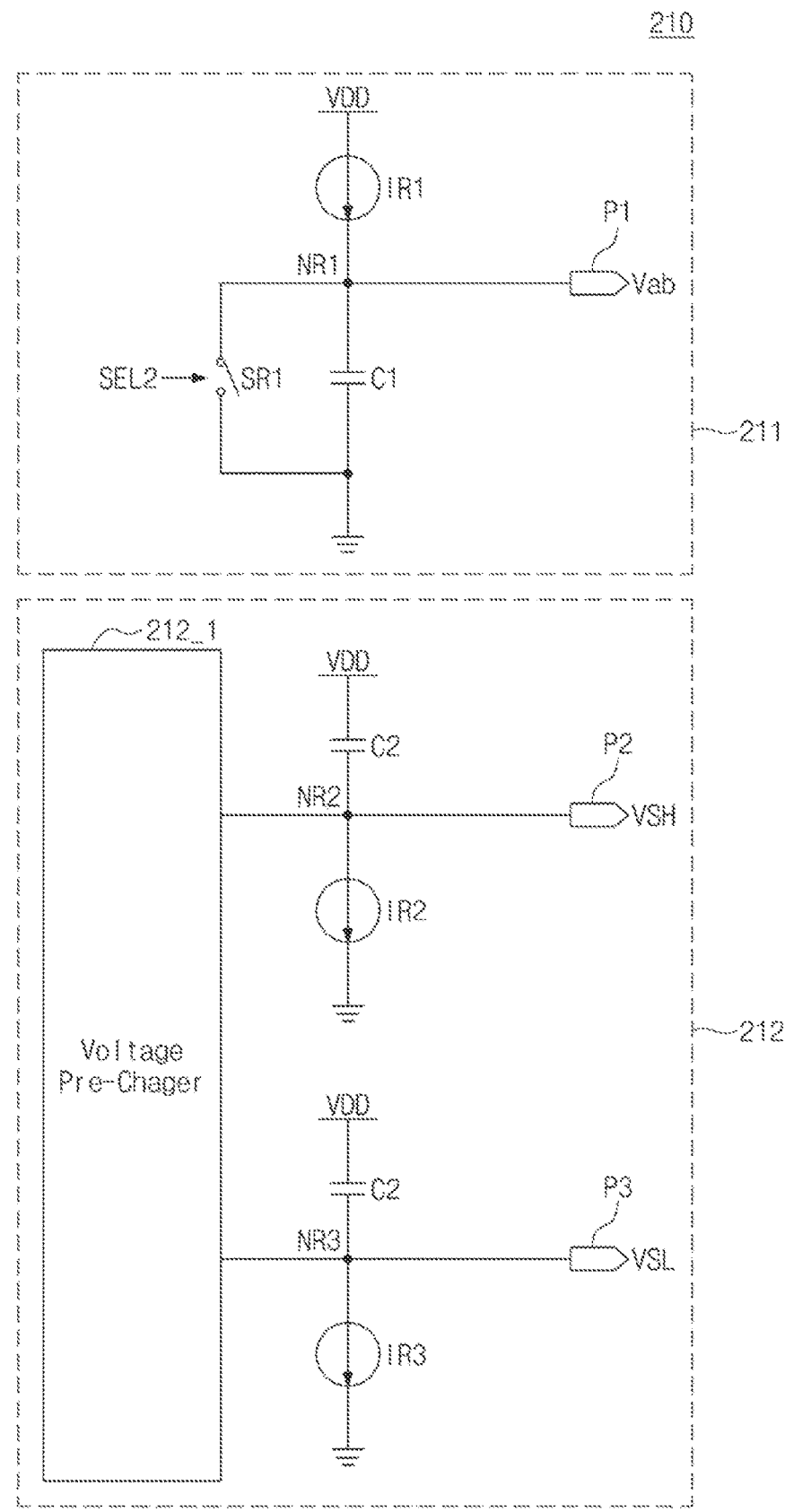
FIG. 7 is a circuit diagram illustrating a configuration and an operation of a ramp signal generator of FIG. 6, according to an embodiment.

FIG. 7 is a circuit diagram illustrating a configuration and an operation of a ramp signal generator of FIG. 6. Referring to FIGS. 6 and 7, the ramp signal generator 210 may include a rising ramp signal generator 211 and a falling ramp signal generator 212. A configuration and an operation of the rising ramp signal generator 211 is similar to the configuration and the operation of the ramp signal generator 210 of FIG. 3, and thus, repeated description will be omitted for conciseness and to avoid redundancy.

The falling ramp signal generator 212 may include a voltage pre-charger 212_1, a second ramp current bias IR2, a second capacitor C2, a second ramp signal output pin P2, a third ramp current bias IR3, a third capacitor C3, and a third ramp signal output pin P3.

Before the ABIST operation is performed (i.e., before the monitoring circuit 100 operates in the second mode), the voltage pre-charger 212_1 may pre-charge (or reset) voltages of a second ramp node NR2 and a third ramp node NR3 to a specific level determined in advance. Accordingly, the second ramp node NR2 and the third ramp node NR3 may be set to the same voltage level before the ABIST operation. However, the present disclosure is not limited thereto. For example, in some embodiments, the second ramp node NR2 and the third ramp node NR3 may be set to different voltage levels. Although not illustrated, the voltage pre-charger 212_1 may operate in response to an initiation signal (e.g., the ABIST enable signal ABIST_EN, the first selection signal SEL1, and/or the second selection signal SEL2) having a specific level (e.g., logic high).

The second capacitor C2 may be connected between the power supply voltage (VDD) terminal and the second ramp node NR2. A capacitance of the second capacitor C2 may change depending on a request of the user or settings of the manufacturer. The second ramp current bias IR2 may be connected between the second ramp node NR2 and the ground voltage terminal. A uniform current may flow between the second ramp node NR2 and the ground voltage terminal by the second ramp current bias IR2. A current level of the second ramp current bias IR2 may change depending on a request of the user or settings of the manufacturer.

Before the ABIST operation is performed, the voltage level of the second ramp node NR2 may be maintained by the voltage pre-charger 212_1. Accordingly, charges may be charged in the second capacitor C2. In the case where the ABIST controller 200 performs the ABIST on the monitoring circuit 100 (i.e., in the case where the monitoring circuit 100 operates in the second mode), the voltage pre-charger 212_1 may not operate. Accordingly, charges in the second capacitor C2 may be discharged. In this case, because the second ramp current bias IR2 drains a current of a uniform level, a level of a voltage (i.e., the second ramp signal VSH) of the second ramp node NR2 may decrease with a uniform slope. Accordingly, the second ramp signal VSH may be a signal of a triangular waveform to which there is applied a characteristic of the second capacitor C2 that is charged or discharged over time. The slope of the second ramp signal VSH may change depending on the current level of the second ramp current bias IR2 and the capacitance of the second capacitor C2. The second ramp signal VSH may be transferred to the second comparator COMP2 through the second ramp signal output pin P2.

Operations, functions, and a connection relationship of the third ramp current bias IR3 and the third capacitor C3 is similar to the operations, the functions, and the connection relationship of the second ramp current bias IR2 and the second capacitor C2, and thus, a repeated description will be omitted for conciseness and to avoid redundancy. The third ramp signal VSL may be transferred to the third comparator COMP3 through the third ramp signal output pin P3. According to an embodiment, the current level of the second ramp current bias IR2 and the current level of the third ramp current bias IR3 may be different. Additionally or alternatively, the capacitance of the second capacitor C2 and the capacitance of the third capacitor C3 may be different. Accordingly, the slope of the second ramp signal VSH may be different from the slope of the third ramp signal VSL. According to an embodiment, an absolute value of the slope of the second ramp signal VSH may be smaller than an absolute value of the slope of the third ramp signal VSL. Because the time window is determined based on arbitrary or preset slopes of the second ramp signal VSH and the third ramp signal VSL, the resolution for the comparator output COUT may not be limited.

According to an embodiment, the first ramp signal Vab may be a rising ramp signal, and the second and third ramp signals VSH and VSL may be falling ramp signals. That is, the first comparator COMP1 may compare the rising ramp signal and the sensing voltage V_SEN, and each of the second and third comparators COMP2 and COMP3 may compare the falling ramp signal and the sensing voltage V_SEN. A systematic fault capable of occurring in terms of a structure and a design may be removed by changing the properties of ramp signals that the first comparator COMP1 and the second and third comparators COMP2 and COMP3 receive.

Figure 8A:
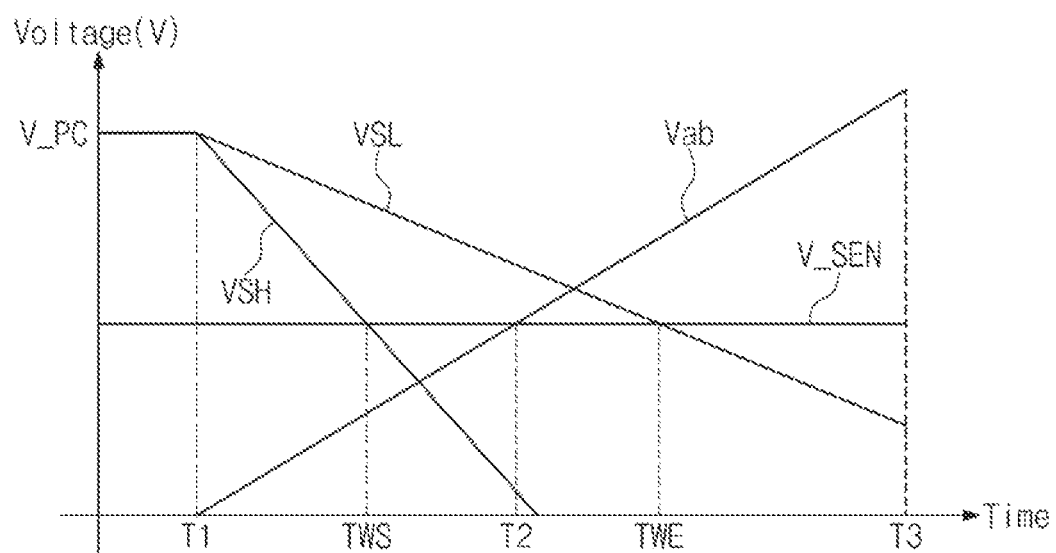
FIG. 8A is a graph illustrating voltage levels of a sensing voltage and a ramp signal when a monitoring circuit of FIG. 6 is operating normally.

FIG. 8A is a graph illustrating voltage levels of a sensing voltage and a ramp signal when a monitoring circuit of FIG. 6 is operating normally. For convenience of description, FIG. 8A will be described with reference to FIG. 6.

The ramp signal generator 210 may generate the first to third ramp signals Vab, VSH, and VSL. At point in time T1 (e.g., at a point in time when the ABIST enable signal ABIST_EN transitions from logic low to logic high), the first ramp signal Vab may increase with a uniform slope. Also, the second and third ramp signals VSH and VSL may decrease from a level of a pre-charged voltage V_PC with a uniform slope. Herein, the slope of the second ramp signal VSH may be different from the slope of the third ramp signal VSL. The sensing voltage V_SEN that is maintained at a uniform level may be input to the first to third comparators COMP1, COMP2, and COMP3.

At point in time TWS, the voltage level of the second ramp signal VSH may be equal to the voltage level of the sensing voltage V_SEN. Accordingly, the second comparator COMP2 may output a signal (i.e., the first comparison voltage V1) whose logical value is changed (e.g., to logic high) at point in time TWS. As in the above description, at point in time TWE, the voltage level of the third ramp signal VSL may be equal to the voltage level of the sensing voltage V_SEN. Accordingly, the third comparator COMP3 may output a signal (i.e., the second comparison voltage V2) whose logical value is changed (e.g., to logic low) at point in time TWE.

At point in time T2, the voltage level of the first ramp signal Vab may be equal to the voltage level of the sensing voltage V_SEN. Accordingly, the first comparator COMP1 may output a signal (i.e., the comparator output COUT) whose logical value is changed (e.g., to logic high) at point in time T2. Because the point in time T2 is between the point in time TWS and the point in time TWE (i.e., within a time window), it may be determined that the first comparator COMP1 operates normally.

At point in time T3 (e.g., at a point in time when the ABIST enable signal ABIST_EN transitions from logic high to logic low), the first to third ramp signals Vab, VSH, and VSL may be reset. For example, the voltage levels of the first to third ramp signals Vab, VSH, and VSL may be reset to the voltage levels at point in time T1.

Figure 8B:
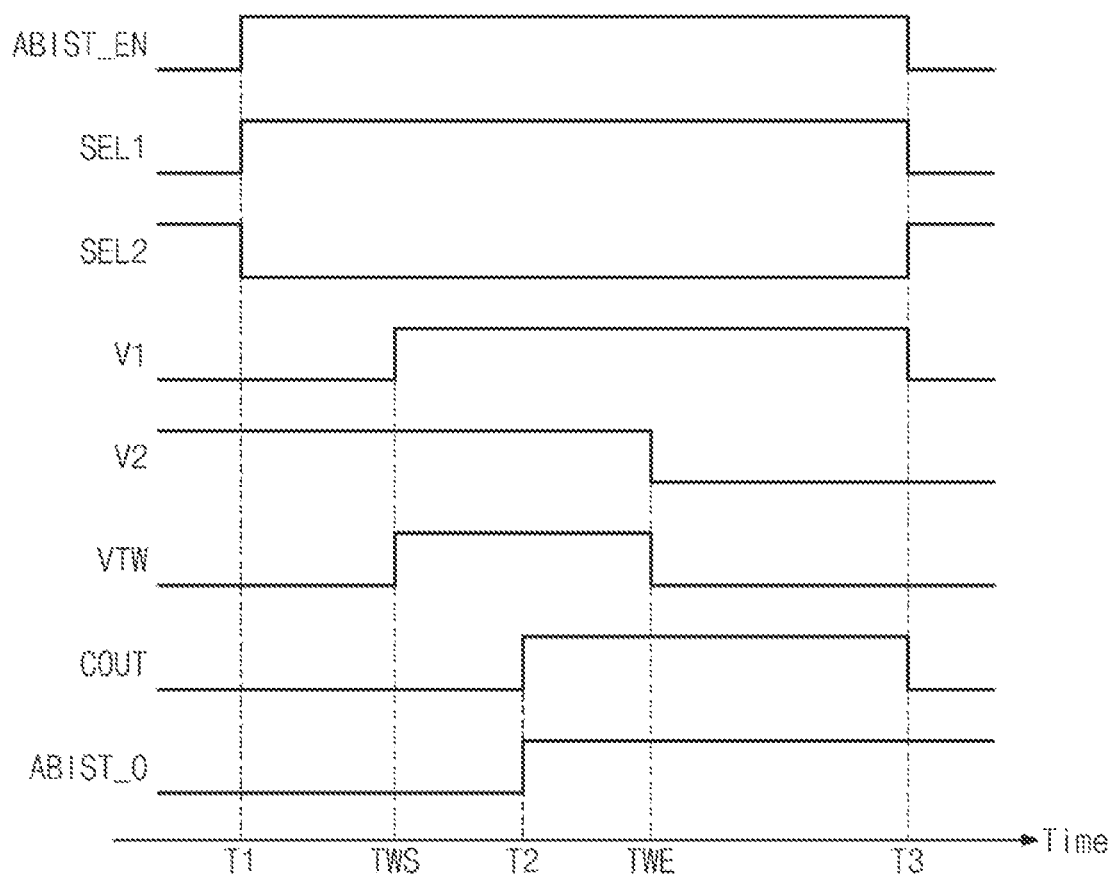
FIG. 8B is a timing diagrams illustrating logical values of signals according to points in time of FIG. 8A.

FIG. 8B is a timing diagrams illustrating logical values of signals according to points in time of FIG. 8A. Repeated description to the description given with reference to FIG. 8A will be omitted for conciseness and to avoid redundancy. For convenience of description, FIG. 8B will be described with reference to FIGS. 6 and 8A.

At point in time T1, the ABIST enable signal ABIST_EN may transition from logic low to logic high. In response to a rising edge of the ABIST enable signal ABIST_EN, the first selection signal SEL1 may transition from logic low to logic high, and the second selection signal SEL2 may transition from logic high to logic low.

At point in time TWS, the first comparison voltage V1 that is a result of comparing the second ramp signal VSH and the sensing voltage V_SEN may transition from logic low to logic high. In this case, because the second comparison voltage V2 that is a result of comparing the third ramp signal VSL and the sensing voltage V_SEN is at logic high, the time window signal VTW that the AND gate G1 outputs may transition from logic low to logic high.

At point in time TWE, the second comparison voltage V2 may transition from logic high to logic low. In this case, because the first comparison voltage V1 is at logic high, the time window signal VTW that the AND gate G1 outputs may transition from logic high to logic low. That is, the time window signal VTW may be at logic high between the point in time TWS and the point in time TWE.

At point in time T2, the comparator output COUT may transition from logic low to logic high. Because the rising edge of the comparator output COUT is present in the logical high period of the time window signal VTW, the logic controller 220 may transfer the ABIST output ABIST_O indicating the normal operation of the first comparator COMP1 to the upper system. For example, in some embodiments, the ABIST controller 200 may generate the ABIST output ABIST_O of logic high to indicate that the monitoring circuit 100 is operating normally. In other embodiments, the ABIST controller 200 may generate the ABIST output ABIST_O that pulses to logic high to indicate that the monitoring circuit 100 is operating normally.

Figure 9A:
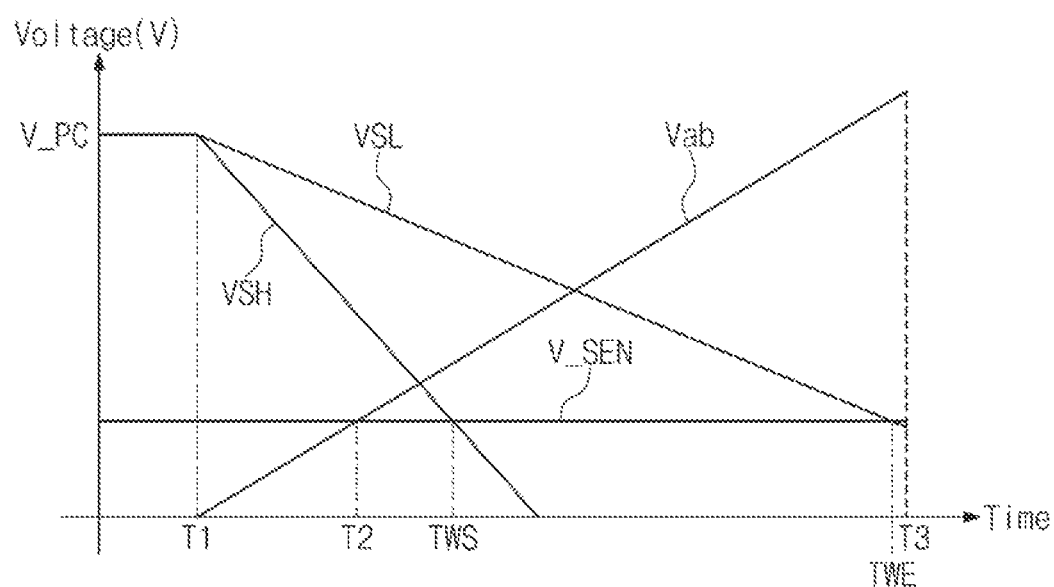
FIG. 9A is a graph illustrating voltage levels of a sensing voltage and a ramp signal when a monitoring circuit of FIG. 6 is operating abnormally.

FIG. 9A is a graph illustrating voltage levels of a sensing voltage and a ramp signal when a monitoring circuit of FIG. 6 is operating abnormally. Repeated description to the description given with reference to FIG. 8A will be omitted for conciseness and to avoid redundancy. For convenience of description, FIG. 9A will be described with reference to FIG. 6.

In the case where the monitoring circuit 100 does not operate normally (e.g., in the case where the first resistor R1 and/or the second resistor R2 is degraded, in the case where the first comparator COMP1 is out of an operating range, or in the case where an internal circuit is short-circuited), the level of the sensing voltage V_SEN may be lower than that in the normal range. Because the sensing voltage V_SEN is input to the first to third comparators COMP1, COMP2, and COMP3, points in time when the logical values of the outputs of the first to third comparators COMP1, COMP2, and COMP3 change may be different from those described with reference to FIG. 8A.

For example, point in time TWS and point in time TWE may lag behind those described with reference to FIG. 8A, and point in time T2 may lead the normal range compared to FIG. 8A. The point in time T2 (i.e., a point in time when the voltage level of the first ramp signal Vab and the voltage level of the sensing voltage V_SEN cross each other) may not exist in the period from point in time TWS to point in time TWE (i.e., in the time window). Accordingly, it may be determined that the first comparator COMP1 does not operate normally.

Figure 9B:
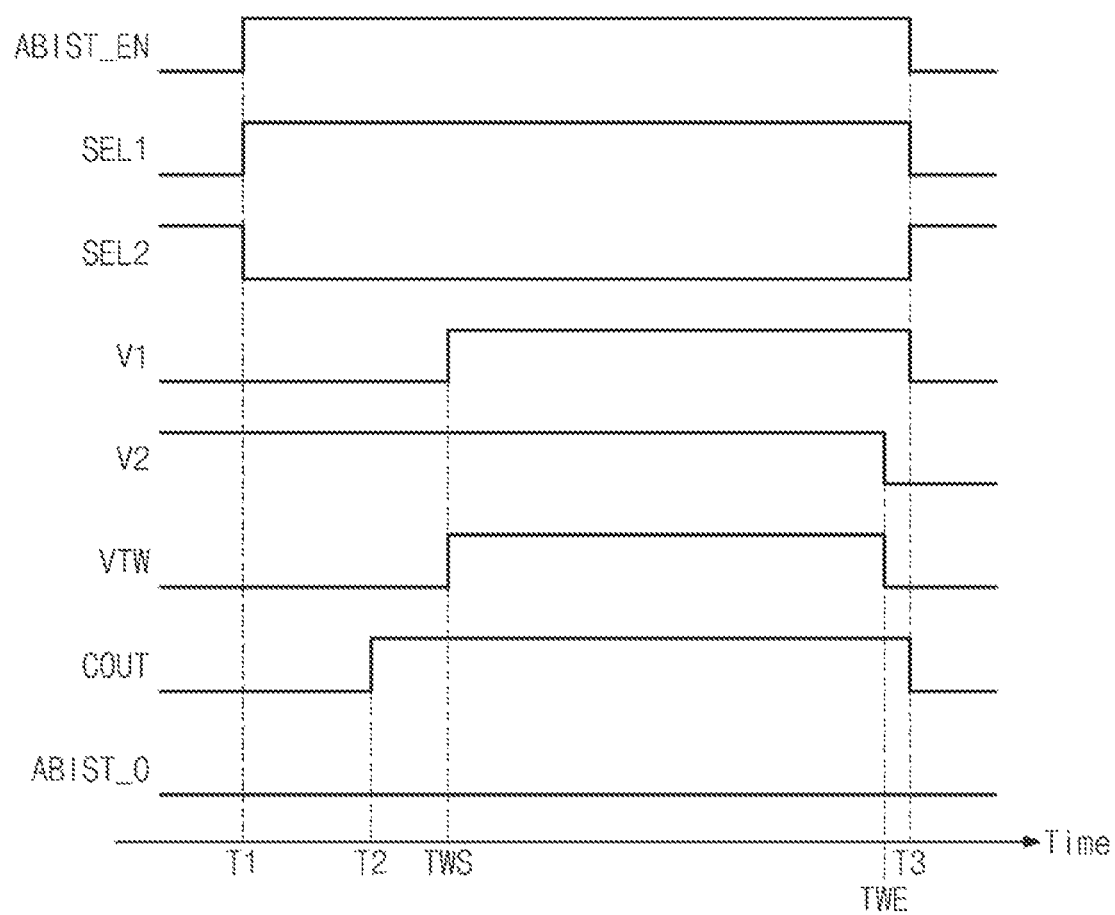
FIG. 9B is a timing diagrams illustrating logical values of signals according to points in time of FIG. 9A.

FIG. 9B is a timing diagrams illustrating logical values of signals according to points in time of FIG. 9A. Repeated description to the description given with reference to FIGS. 8B and 9A will be omitted for conciseness and to avoid redundancy. For convenience of description, FIG. 9B will be described with reference to FIGS. 6 and 9A.

At point in time T2, the comparator output COUT may transition from logic low to logic high. Because the rising edge of the comparator output COUT is present in the logical low period of the time window signal VTW (i.e., before the time window), the logic controller 220 may transfer the ABIST output ABIST_O indicating the abnormal operation of the first comparator COMP1 to the upper system.

Figure 10A:
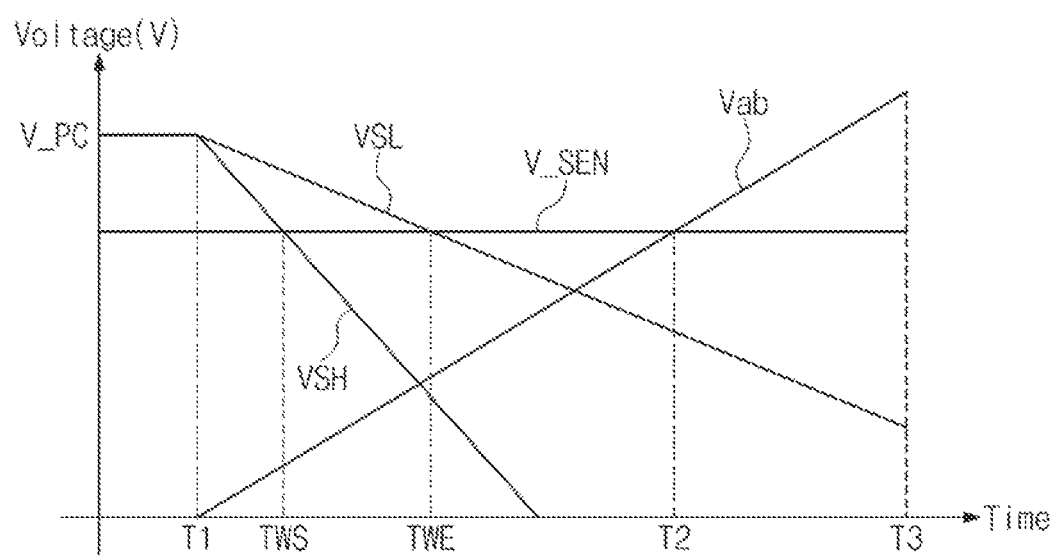
FIG. 10A is a graph illustrating voltage levels of a sensing voltage and a ramp signal when a monitoring circuit of FIG. 6 is operating abnormally.

FIG. 10A is a graph illustrating voltage levels of a sensing voltage and a ramp signal when a monitoring circuit of FIG. 6 is operating abnormally. Repeated description to the description given with reference to FIGS. 8A and 9A will be omitted for conciseness and to avoid redundancy. For convenience of description, FIG. 10A will be described with reference to FIG. 6.

In the case where the monitoring circuit 100 does not operate normally, the level of the sensing voltage V_SEN may be higher than that in the normal range. Because the sensing voltage V_SEN is input to the first to third comparators COMP1, COMP2, and COMP3, points in time when the logical values of the outputs of the first to third comparators COMP1, COMP2, and COMP3 change may be different from those described with reference to FIG. 8A.

For example, point in time TWS and point in time TWE may lead those described with reference to FIG. 8A, and point in time T2 may lag behind the normal range compared to FIG. 8A. The point in time T2 (i.e., a point in time when the voltage level of the first ramp signal Vab and the voltage level of the sensing voltage V_SEN cross each other) may not exist in the period from point in time TWS to point in time TWE (i.e., in the time window). Accordingly, it may be determined that the first comparator COMP1 does not operate normally.

Figure 10B:
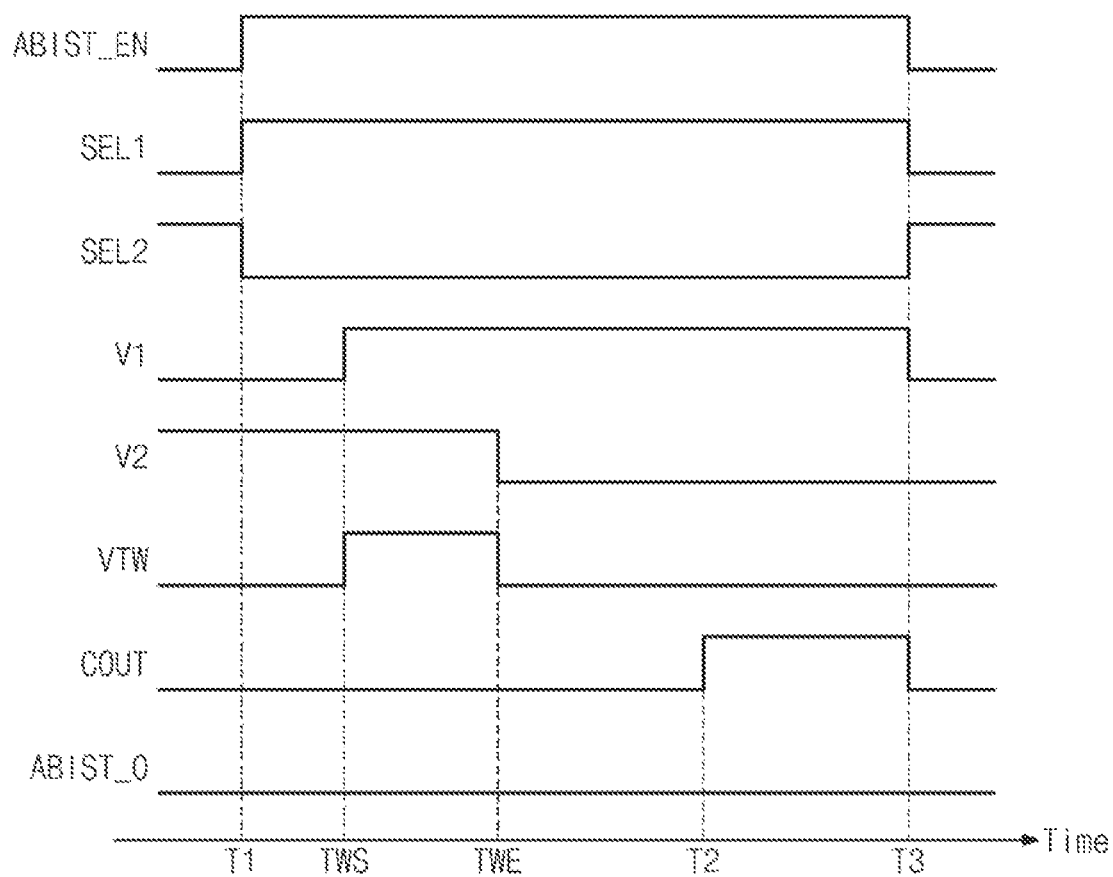
FIG. 10B is a timing diagram illustrating logical values of signals according to points in times of FIG. 10A.

FIG. 10B is a timing diagram illustrating logical values of signals according to points in times of FIG. 10A. Repeated description to the description given with reference to FIGS. 8B and 10A will be omitted for conciseness and to avoid redundancy. For convenience of description, FIG. 10B will be described with reference to FIGS. 6 and 10A.

At point in time T2, the comparator output COUT may transition from logic low to logic high. Because the rising edge of the comparator output COUT is present in the logical low period of the time window signal VTW (i.e., after the time window), the logic controller 220 may transfer the ABIST output ABIST_O indicating the abnormal operation of the first comparator COMP1 to the upper system.

Figure 11:
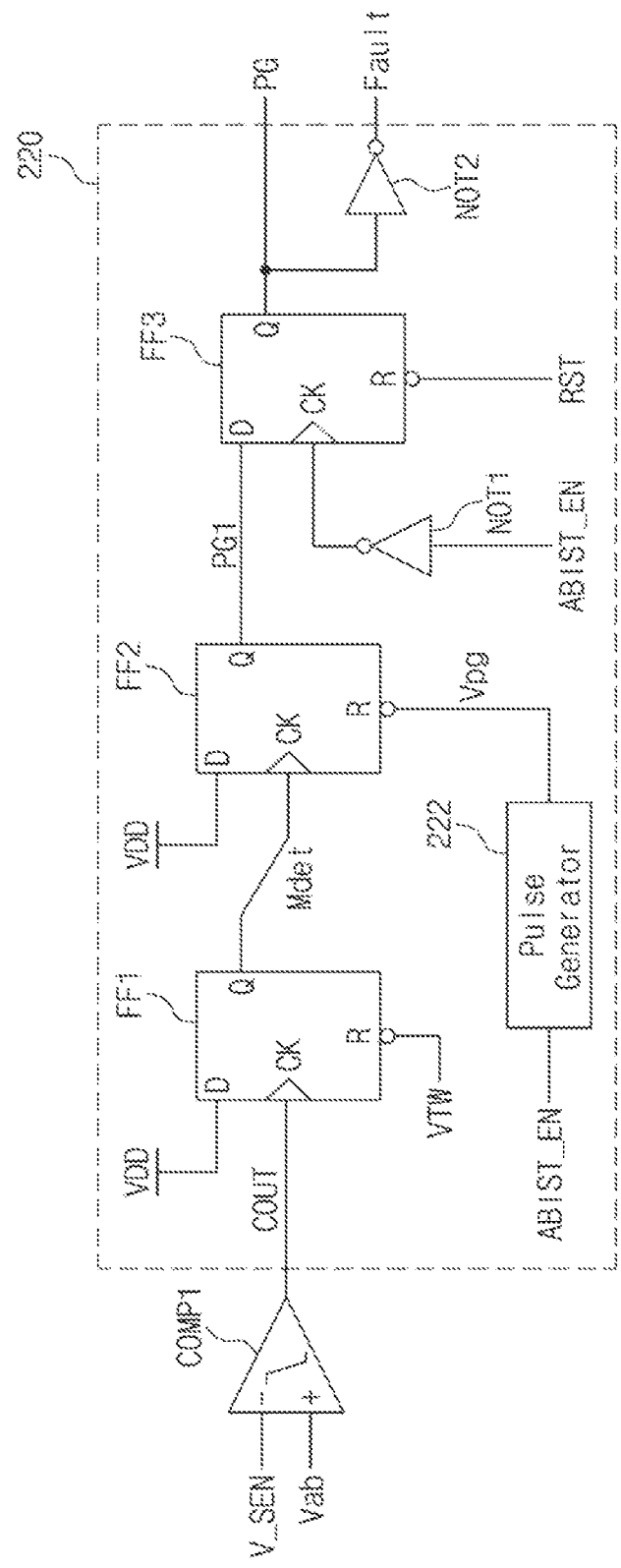
FIG. 11 is a circuit diagram illustrating a configuration and an operation of a logic controller, according to an embodiment.

FIG. 11 is a circuit diagram illustrating a configuration and an operation of a logic controller. For convenience of description, FIG. 11 will be described with reference to FIG. 6. The logic controller 220 may include a first flip-flop FF1, a second flip-flop FF2, a third flip-flop FF3, a pulse generator 222, a first NOT gate NOT1, and a second NOT gate NOT2.

Each of the first to third flip-flops FF1, FF2, and FF3 may include an input terminal "D", an output terminal "Q", a clock terminal CK, and a reset terminal "R". For example, in some embodiments, each of the first to third flip-flops FF1, FF2, and FF3 may be a D flip-flop. Each of the first to third flip-flops FF1, FF2, and FF3 may latch a logical value of an input signal received through the input terminal "D" at an edge of a clock signal received through the clock terminal CK and may output an output signal having the latched logical value through the output terminal "Q".

Each of the first to third flip-flops FF1, FF2, and FF3 may reset a logical value of the output signal to be output through the output terminal "Q" to a given value (e.g., logic high or logic low) in response to a reset signal received through the reset terminal "R". When the reset signal is activated, each of the first to third flip-flops FF1, FF2, and FF3 may reset a logical value of the output signal. Each of the first to third flip-flops FF1, FF2, and FF3 may latch a logical value of the input signal at an edge of the clock signal received through the clock terminal CK, with the reset signal not activated.

According to an embodiment, in the first flip-flop FF1, the clock terminal CK may be connected with the output terminal of the first comparator COMP1, the input terminal "D" may be connected with the power supply voltage (VDD) terminal, the output terminal "Q" may be connected with the clock terminal CK of the second flip-flop FF2, and the reset terminal "R" may be connected with the output terminal of the AND gate G1. In the second flip-flop FF2, the clock terminal CK may be connected with the output terminal "Q" of the first flip-flop FF1, the input terminal "D" may be connected with the power supply voltage (VDD) terminal, the output terminal "Q" may be connected with the input terminal "D" of the third flip-flop FF3, and the reset terminal "R" may be connected with an output of the pulse generator 222. In the third flip-flop FF3, the clock terminal CK may be connected with the first NOT gate NOT1, the input terminal "D" may be connected with the output terminal "Q" of the second flip-flop FF2, the output terminal "Q" may be connected with the upper system (not illustrated), and the reset terminal "R" may be connected with a control unit (not illustrated).

The pulse generator 222 may generate a pulse signal Vpg based on the ABIST enable signal ABIST_EN. When the ABIST enable signal ABIST_EN transitions from logic low to logic high, the pulse signal Vpg may transition to logic low, and then, the pulse signal Vpg may transition to logic high in an instant.

Each of the first and second NOT gates NOT1 and NOT2 may invert a signal input to the NOT gate and output the inverted signal. The first NOT gate NOT1 may invert the ABIST enable signal ABIST_EN. An inverted version of the ABIST enable signal ABIST_EN may be transferred to the clock terminal CK of the third flip-flop FF3. The second NOT gate NOT2 may invert a power good signal PG. An inverted version of the power good signal PG may be a fault signal Fault.

According to an embodiment, the first flip-flop FF1 may latch a logical value (i.e., logic high) of the power supply voltage VDD at a rising edge of the comparator output COUT and may output an intermediate detection signal Mdet having the latched logical value. The first flip-flop FF1 may reset the logical value of the intermediate detection signal Mdet to logic low in response to an inverted version of the time window signal VTW. For example, when the inverted version of the time window signal VTW corresponds to a value of logic high, the logical value of the intermediate detection signal Mdet may be reset to logic low.

The second flip-flop FF2 may latch a logical value (i.e., logic high) of the power supply voltage VDD at a rising edge of the intermediate detection signal Mdet and may output an intermediate output signal PG1 having the latched logical value. The second flip-flop FF2 may reset the logical value of the intermediate output signal PG1 to logic low in response to an inverted version of the pulse signal Vpg. For example, when the inverted version of the pulse signal Vpg corresponds to a value of logic high, the logical value of the intermediate output signal PG1 may be reset to logic low.

The third flip-flop FF3 may latch a logical value (i.e., logic high) of the intermediate output signal PG1 at a rising edge of the inverted version of the ABIST enable signal ABIST_EN and may output the power good signal PG having the latched logical value. The third flip-flop FF3 may reset the logical value of the power good signal PG to logic low in response to an inverted version of a system reset signal RST. Herein, the system reset signal RST may have a specific logical value (e.g., logic high) when a control unit (e.g., a power management integrated circuit (PMIC)) is turned on. For example, when the inverted version of the system reset signal RST corresponds to a value of logic high, the logical value of the power good signal PG may be reset to logic low.

Figure 12A:
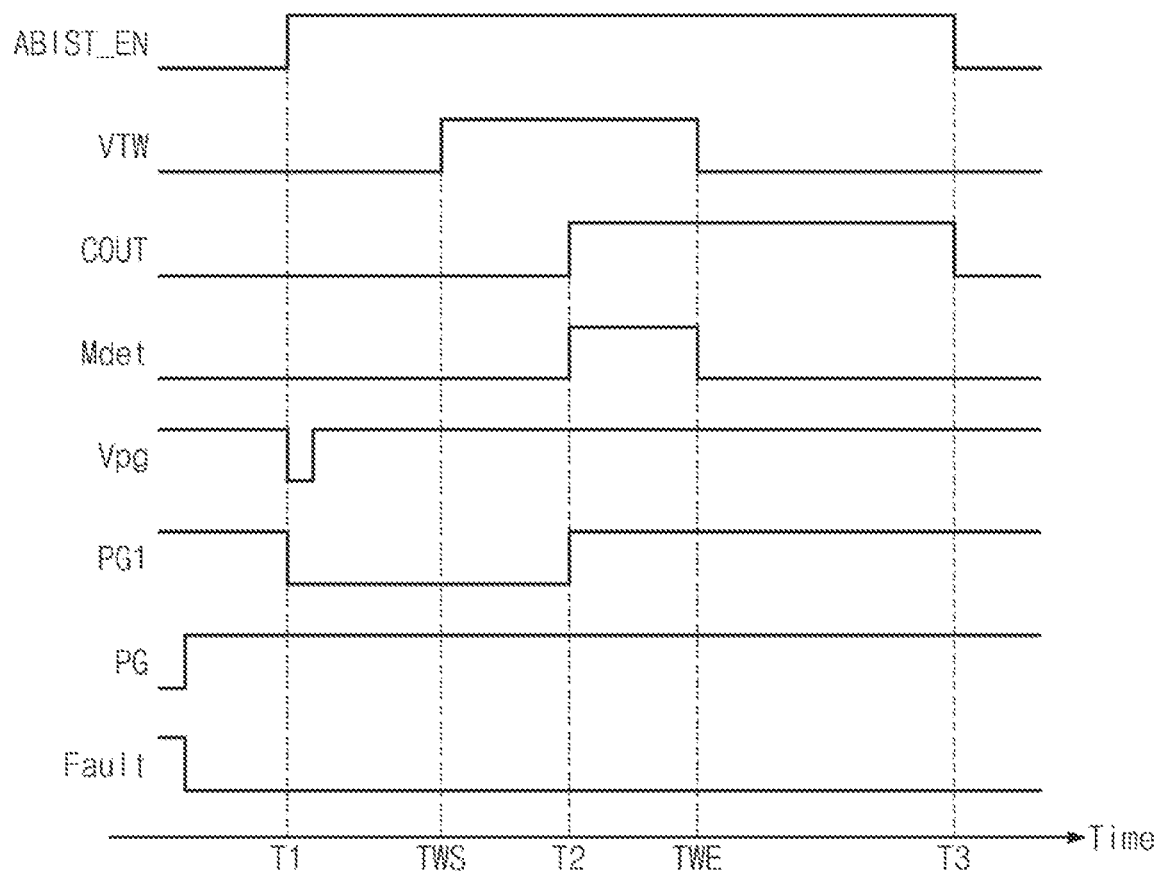
FIGS. 12A to 12C are timing diagrams illustrating an operation of a logic controller of FIG. 11.
Figure 12B:
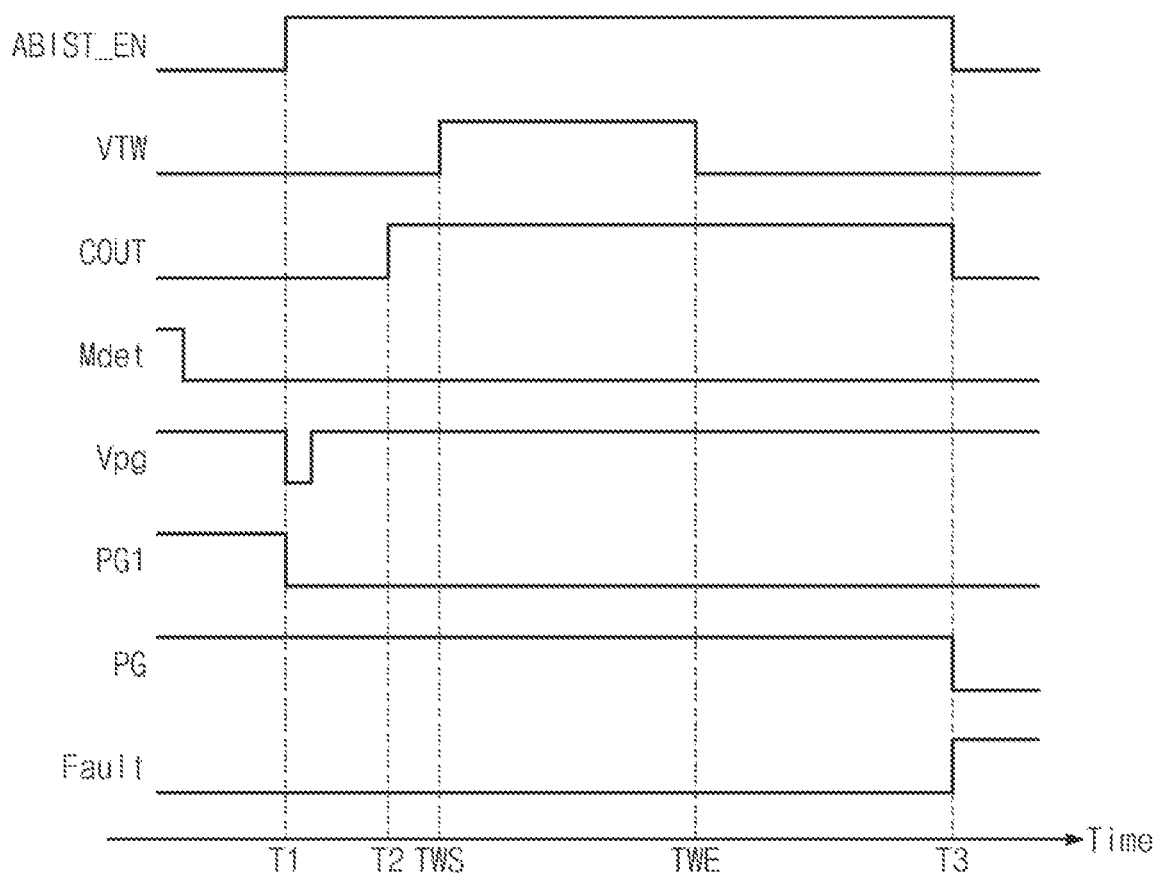
Figure 12C:
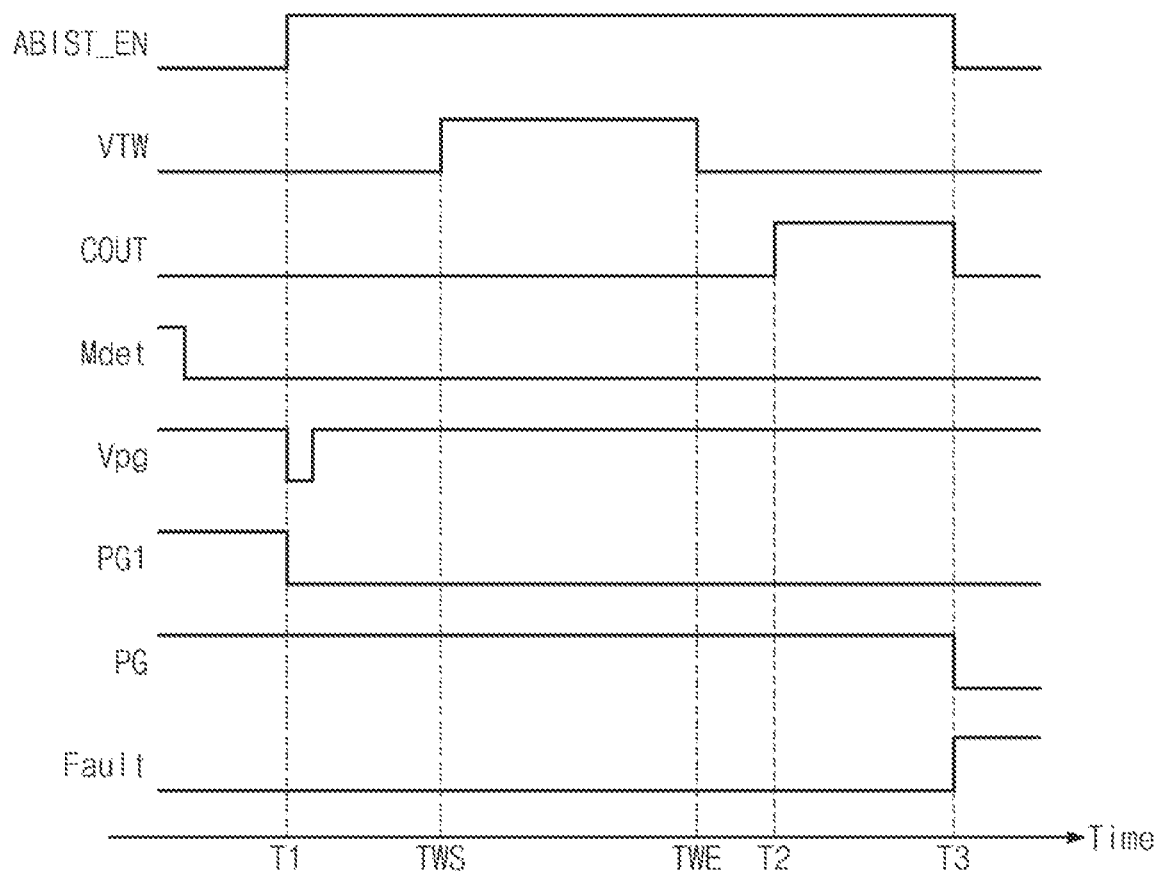

FIGS. 12A to 12C are timing diagrams illustrating operations of the logic controller of FIG. 11. For convenience of description, FIGS. 12A to 12C will be described with reference to FIGS. 6 and 8A to 11. Repeated description to the description given with reference to FIGS. 8A to 10B will be omitted for conciseness and to avoid redundancy.

Referring to FIGS. 12A to 12C, at point in time T1, the ABIST enable signal ABIST_EN may transition from logic low to logic high. That is, the first comparator COMP1 may output the comparator output COUT by comparing signals (i.e., the sensing voltage V_SEN and the first ramp signal Vab) for performing the ABIST.

When the inverted version of the time window signal VTW transitions to logic high, the first flip-flop FF1 may reset the intermediate detection signal Mdet to logic low. That is, the intermediate detection signal Mdet may be triggered in a period from point in time TWS to point in time TWE. At point in time T2, the comparator output COUT may transition from logic low to logic high.

When the inverted version of the pulse signal Vpg transition to logic high, the second flip-flop FF2 may reset the intermediate output signal PG1 to logic low. Herein, the pulse signal Vpg may be triggered at the rising edge of the ABIST enable signal ABIST_EN to have a logical value of logic low and may be then returned to logic high in an instant (i.e., the pulse signal Vpg may pulse low). That is, at point in time T1 when the pulse signal Vpg transitions to logic low, the intermediate output signal PG1 may be reset to logic low.

When the inverted version of the system reset signal RST transitions to logic high, the third flip-flop FF3 may reset the power good signal PG to logic low. While the whole system including the electronic circuit 10 operates, the system reset signal RST may be at logic high. Accordingly, because the whole system is operating, the description will be given under the assumption that the power good signal PG is not reset.

While the monitoring circuit 100 operates normally, the logical value of the power good signal PG may maintain logic high. The power good signal PG may be triggered at a rising edge of the inverted version of the ABIST enable signal ABIST_EN. In other words, the power good signal PG may be triggered at a falling edge of the ABIST enable signal ABIST_EN formed at point in time T3.

Referring to FIG. 12A, because the inverted version of the time window signal VTW (note that FIG. 12A shows the uninverted signal VTW and thus the inverted version is the opposite of that illustrated in FIG. 12A) is at logic low at point in time T2, the intermediate detection signal Mdet may be triggered at the rising edge of the comparator output COUT without being reset. The intermediate detection signal Mdet may transition to logic high being a logical value corresponding to the power supply voltage VDD at point in time T2, and may be reset to logic low at point in time TWE.

At point in time T2, the intermediate output signal PG1 may be triggered at the rising edge of the intermediate detection signal Mdet. That is, the intermediate output signal PG1 may transition to logic high being the logical value corresponding to the power supply voltage VDD.

At point in time T3, because the intermediate output signal PG1 is at logic high, the logical value of the power good signal PG may maintain logic high. Because the fault signal Fault corresponds to the inverted version of the power good signal PG, the logical value of the fault signal Fault may maintain logic low. In some embodiments, the fault signal Fault may correspond to the ABIST output ABIST_O.

Referring to FIGS. 12B and 12C, because the inverted version of the time window signal VTW (note that FIGS. 12B-12C show the uninverted signal VTW and thus the inverted version is the opposite of that illustrated in FIGS. 12B-12C) is at logic high at point in time T2, the intermediate detection signal Mdet may not be triggered at the rising edge of the comparator output COUT. Because a rising edge is not formed at the comparator output COUT in the period from TWS to TWE, the intermediate detection signal Mdet may maintain logic low.

Since the intermediate detection signal Mdet maintains logic low, a rising edge may not be formed. Accordingly, the intermediate output signal PG1 that is triggered at the rising edge of the intermediate detection signal Mdet may maintain logic low.

At point in time T3, the power good signal PG may be triggered at the falling edge of the ABIST enable signal ABIST_EN. That is, because the logical value of the intermediate output signal PG1 is logic low, the power good signal PG may transition from logic high to logic low. Because the fault signal Fault corresponds to the inverted version of the power good signal PG, the fault signal Fault may transition from logic low to logic high. In some embodiments, the fault signal Fault may correspond to the ABIST output ABIST_O.

Figure 13:
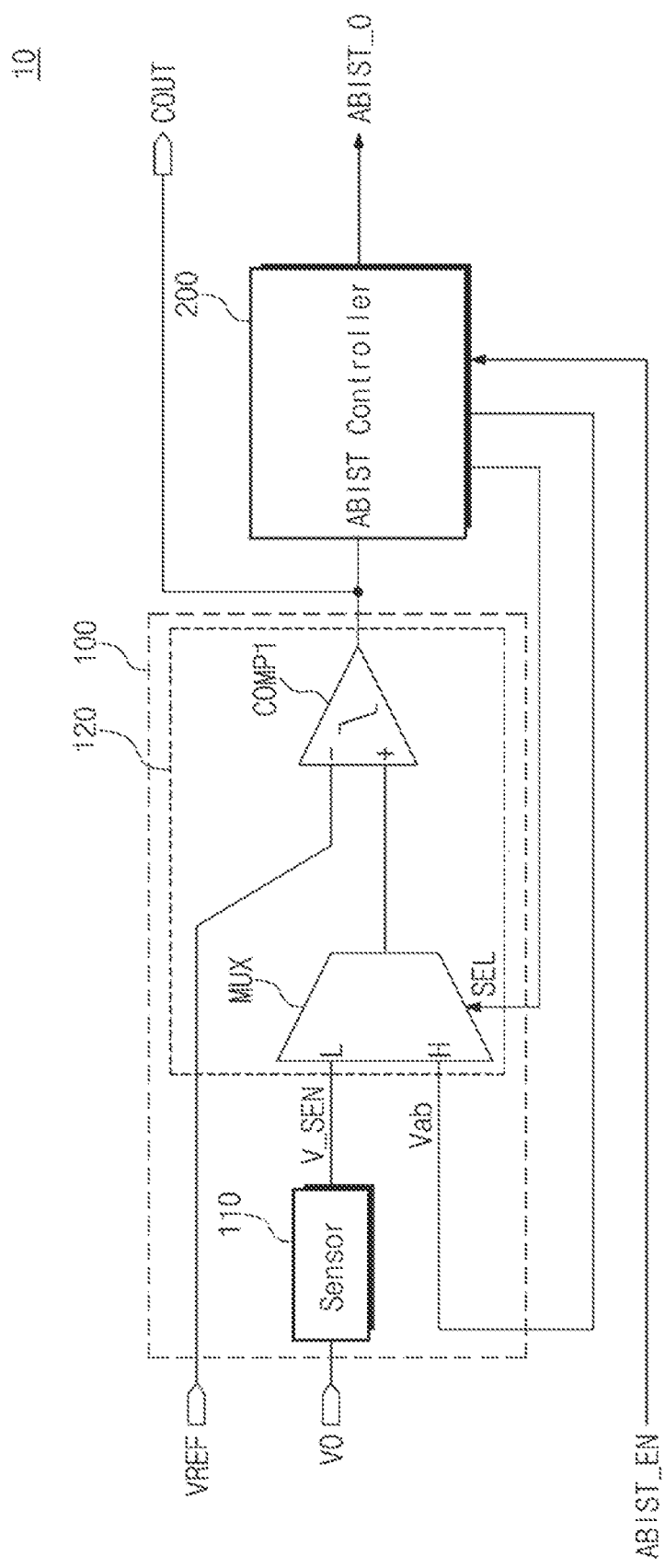
FIG. 13 is a conceptual diagram illustrating an electronic circuit, according to an embodiment.

FIG. 13 is a conceptual diagram illustrating an electronic circuit according to an embodiment. Repeated description to the description given with reference to FIG. 1 will be omitted for conciseness and to avoid redundancy. The electronic circuit 10 may include the monitoring circuit 100 and the ABIST controller 200.

The monitoring circuit 100 may include the sensor 110 and the comparison circuit 120. The monitoring circuit 100 may operate in the first mode in which the ABIST is not performed or the second mode in which the ABIST is performed, depending on a logical value of a selection signal SEL. For example, when the selection signal SEL is at logic low, the monitoring circuit 100 may operate in the first mode. In contrast, when the selection signal SEL is at logic high, the monitoring circuit 100 may operate in the second mode. However, the present disclosure is not limited thereto. For example, a relationship between the logical value of the selection signal SEL and modes may be opposite to that described above in this paragraph. An operation and a configuration of the sensor 110 are similar to the operation and the configuration of the sensor 110 of FIG. 1, and thus, repeated description will be omitted for conciseness and to avoid redundancy. The comparison circuit 120 may include the first comparator COMP1 and a multiplexer MUX.

The first comparator COMP1 may generate the comparator output COUT by comparing the reference voltage VREF and an output (e.g., the sensing voltage V_SEN or the first ramp signal Vab) of the multiplexer MUX. The first comparator COMP1 may include a positive input terminal, a negative input terminal, and an output terminal. The output of the multiplexer MUX may be input to the positive input terminal of the first comparator COMP1, the reference voltage VREF may be input to the negative input terminal of the first comparator COMP1, and the comparator output COUT may be output from the output terminal of the first comparator COMP1. Although not illustrated, in some embodiments, the first comparator COMP1 may further include a positive power terminal and a negative power terminal, and separate bias voltages may be respectively applied to the positive power terminal and the negative power terminal.

The multiplexer MUX may output the sensing voltage V_SEN or the first ramp signal Vab in response to the selection signal SEL. For example, the multiplexer MUX may output the first ramp signal Vab in response to the selection signal SEL of logic high. In contrast, the multiplexer MUX may output the sensing voltage V_SEN in response to the selection signal SEL of logic low. However, the present disclosure is not limited thereto. For example, a relationship between the logical value of the selection signal SEL and an output of the multiplexer MUX may be opposite to that described above in this paragraph. The multiplexer MUX may include a plurality of switches or logic elements that are turned on/off in response to a plurality of signals.

The ABIST controller 200 may operate in response to the ABIST enable signal ABIST_EN. For example, when the ABIST enable signal ABIST_EN is at logic high, the ABIST controller 200 may generate the selection signal SEL of logic high. In contrast, when the ABIST enable signal ABIST_EN is at logic low, the ABIST controller 200 may generate the selection signal SEL of logic low. The ABIST controller 200 may generate the first ramp signal Vab. A voltage level of the first ramp signal Vab may have a uniform slope. For example, the first ramp signal Vab may be a signal whose voltage level increases with the uniform slope. Based on the comparator output COUT, the ABIST controller 200 may generate the ABIST output ABIST_O indicating whether the monitoring circuit 100 operates normally. A configuration, a function, and an operation of the ABIST controller 200 will be described in detail with reference to FIG. 14.

Figure 14:
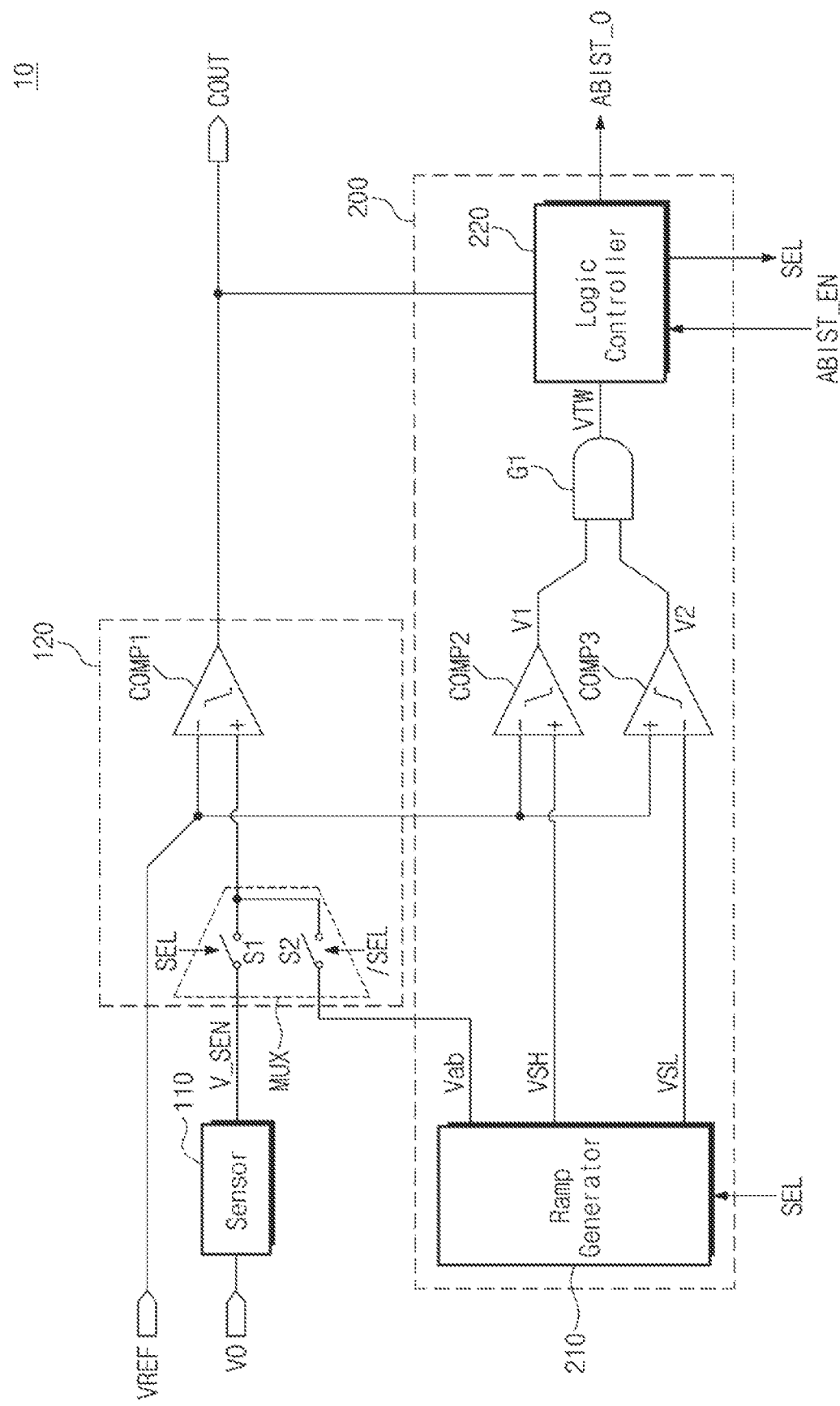
FIG. 14 is a circuit diagram illustrating a configuration and an operation of the electronic circuit of FIG. 13, according to an embodiment.

FIG. 14 is a circuit diagram illustrating a configuration and an operation of an electronic circuit of FIG. 13. Repeated description to the description given with reference to FIG. 13 will be omitted for conciseness and to avoid redundancy. The ABIST controller 200 may include the ramp signal generator 210, the logic controller 220, the second comparator COMP2, the third comparator COMP3, and the AND gate G1.

The ramp signal generator 210 may generate the first ramp signal Vab, the second ramp signal VSH, and the third ramp signal VSL in response to the selection signal SEL. For example, the ramp signal generator 210 may generate the first to third ramp signals Vab, VSH, and VSL based on at least one voltage bias. Herein, the voltage bias may be input from the inside or outside of the ramp signal generator 210. For example, the first ramp signal Vab may be a rising ramp signal, and the second and third ramp signals VSH and VSL may be falling ramp signals. However, the present disclosure is not limited thereto. The ramp signal generator 210 may generate the first to third ramp signals Vab, VSH, and VSL whose characteristics (e.g., an initial voltage level and a slope) vary depending on a request of the user and/or depending on settings of the manufacturer. A configuration and an operation of the ramp signal generator 210 will be described with reference to FIG. 15.

The reference voltage VREF may be applied to the negative input terminal of the second comparator COMP2. The second ramp signal VSH may be applied to the positive input terminal of the second comparator COMP2. The first comparison voltage V1 may be output from the output terminal of the second comparator COMP2.

The second comparator COMP2 may output the first comparison voltage V1 as a result of comparing the reference voltage VREF and the second ramp signal VSH. For example, when the level of the second ramp signal VSH is greater than or equal to the level of the reference voltage VREF, the first comparison voltage V1 may be set to logic high. In contrast, when the level of the second ramp signal VSH is smaller than the level of the reference voltage VREF, the first comparison voltage V1 may be set to logic low.

The reference voltage VREF may be applied to the positive input terminal of the third comparator COMP3. The third ramp signal VSL may be applied to the negative input terminal of the third comparator COMP3. The second comparison voltage V2 may be output from the output terminal of the third comparator COMP3.

The third comparator COMP3 may output the second comparison voltage V2 as a result of comparing the reference voltage VREF and the third ramp signal VSL. For example, when a level of the third ramp signal VSL is greater than the level of the reference voltage VREF, the second comparison voltage V2 may be set to logic low. In contrast, when the level of the third ramp signal VSL is smaller than or equal to the level of the reference voltage VREF, the second comparison voltage V2 may be set to logic high.

Although not illustrated, in some embodiments, each of the second and third comparators COMP2 and COMP3 may further include a positive power terminal and a negative power terminal, and separate bias voltages may be respectively applied to the positive power terminal and the negative power terminal.

The AND gate G1 may include the first input terminal, the second input terminal, and the output terminal. The first input terminal of the AND gate G1 may be connected with the second comparator COMP2. The second input terminal of the AND gate G1 may be connected with the third comparator COMP3. The output terminal of the AND gate G1 may be connected with the logic controller 220. The AND gate G1 may receive the first comparison voltage V1 and the second comparison voltage V2 to output the time window signal VTW. When both the first comparison voltage V1 and the second comparison voltage V2 are at logic high, the time window signal VTW may be set to logic high.

The logic controller 220 may control the ABIST operation in response to the ABIST enable signal ABIST_EN. The logic controller 220 may generate the selection signal SEL based on a logical value of the ABIST enable signal ABIST_EN. An example of a relationship between the ABIST enable signal ABIST_EN and the selection signal SEL will be described with reference to FIG. 16B.

According to an embodiment, when the ABIST enable signal ABIST_EN of logic high is received, the logic controller 220 may perform the ABIST on the monitoring circuit 100. The logic controller 220 may generate the ABIST output ABIST_O indicating whether a logical value of the comparator output COUT changes (e.g., transitions to logic high) within a time window (e.g., a logical high period of the time window signal VTW).

The multiplexer MUX according to an embodiment may include a first switch S1 and a second switch S2. The first switch S1 may be turned on or off in response to the selection signal SEL. The second switch S2 may be turned on or off in response to an inverted version of the selection signal SEL (e.g., /SEL). For example, the first switch S1 may be turned on in response to the selection signal SEL of logic high. In this case, the second switch S2 may be turned off in response to the inverted version of the selection signal SEL. Accordingly, the sensing voltage V_SEN may be applied to the positive input terminal of the first comparator COMP1. In contrast, the first switch S1 may be turned off in response to the selection signal SEL of logic low. In this case, the second switch S2 may be turned on in response to the inverted version of the selection signal SEL. Accordingly, the first ramp signal Vab may be applied to the positive input terminal of the first comparator COMP1.

Figure 15:
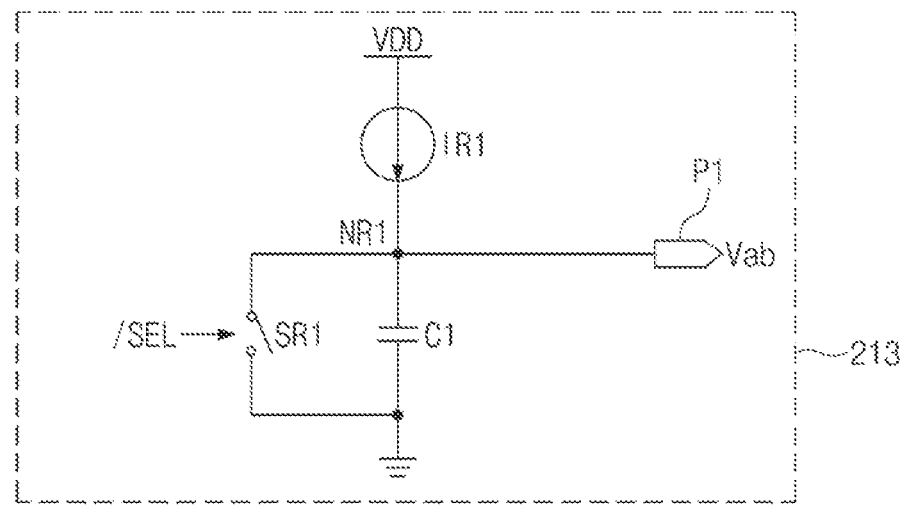
FIG. 15 is a circuit diagram illustrating a configuration and an operation of a ramp signal generator of FIG. 14, according to an embodiment.
Figure 15:
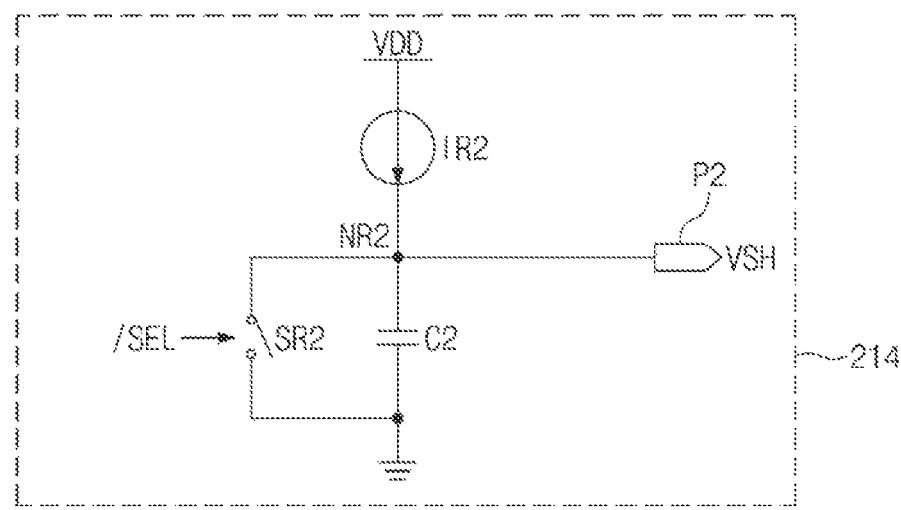
Figure 15:
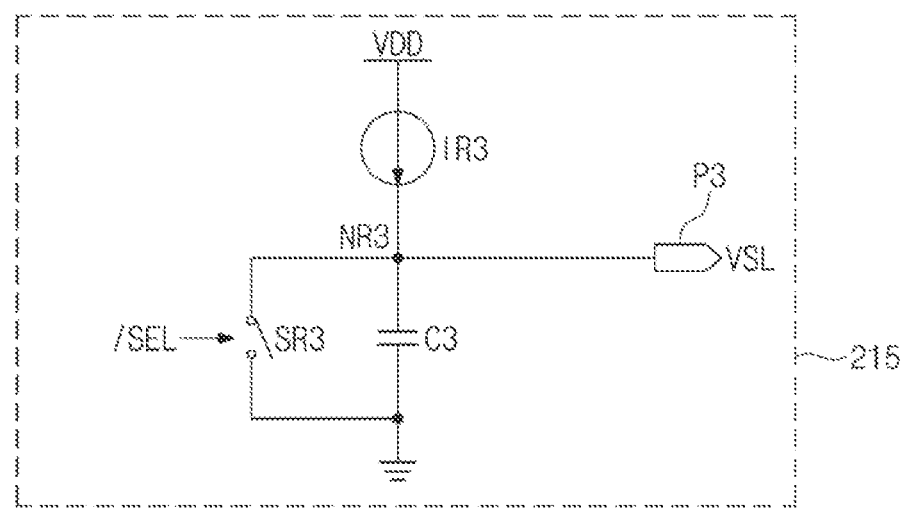

FIG. 15 is a circuit diagram illustrating a configuration and an operation of a ramp signal generator of FIG. 14. Referring to FIGS. 14 and 15, the ramp signal generator 210 may include a first rising ramp signal generator 213, a second rising ramp signal generator 214, and a third rising ramp signal generator 215. Configurations, connection relationships, operations, and functions of the first to third rising ramp signal generators 213, 214, and 215 are similar to those of the rising ramp signal generator 211 of FIG. 7, and thus, repeated description will be omitted for conciseness and to avoid redundancy.

Capacitances of first, second, and third capacitors C1, C2, and C3 may change depending on a request of the user and/or depending on settings of the manufacturer. The capacitances of the first, second, and third capacitors C1, C2, and C3 may be different. As in the above description, current levels of first, second, and third ramp current biases IR1, IR2, and IR3 may change depending on a request of the user and/or depending on settings of the manufacturer. The current levels of first, second, and third ramp current biases IR1, IR2, and IR3 may be different. Accordingly, the slopes of the first to third ramp signals Vab, VSH, and VSL may be different. According to an embodiment, the slope of the second ramp signal VSH may be greater than the slope of the first ramp signal Vab, and the slop of the third ramp signal VSL may be smaller than the slope of the first ramp signal Vab.

Figure 16A:
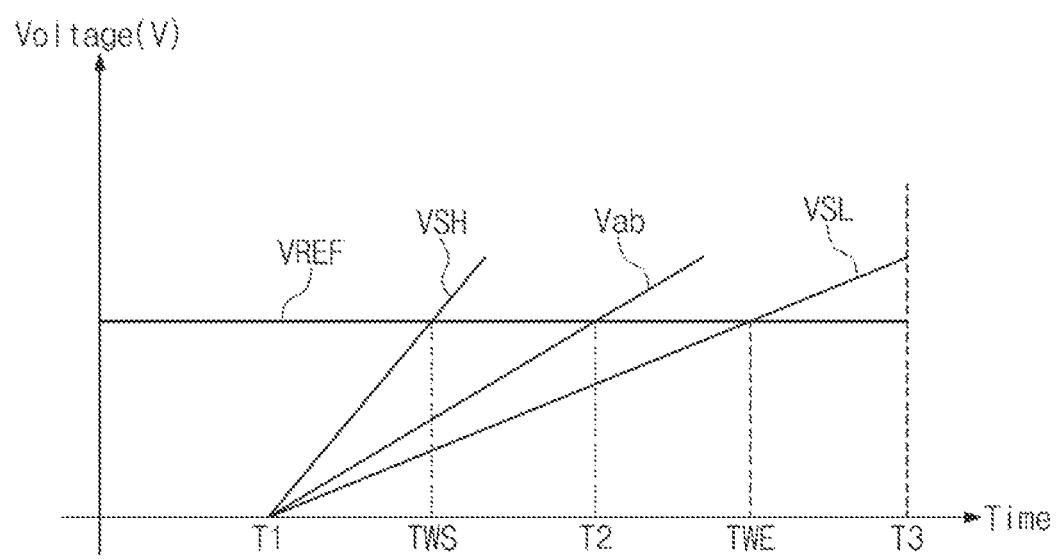
FIGS. 16A and 16B are a graph and a timing diagram illustrating an operation of an electronic circuit of FIG. 14.
Figure 16B:
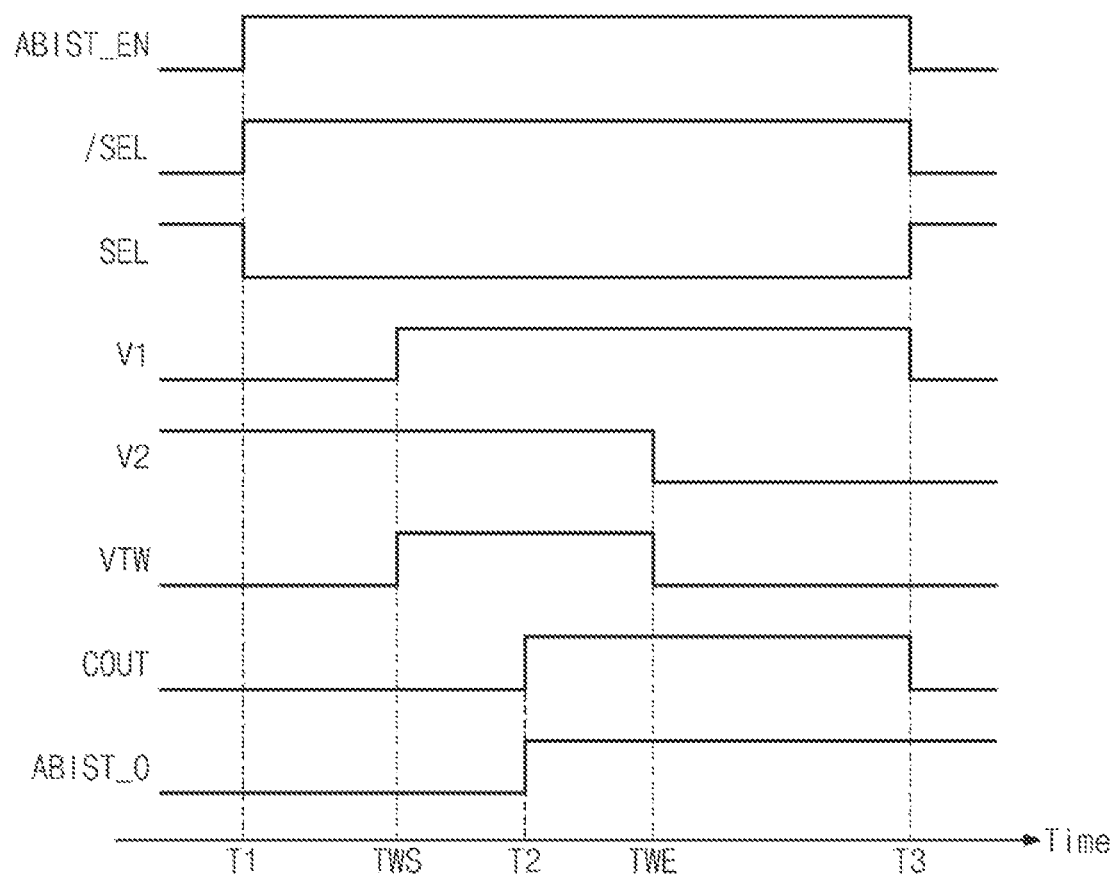

FIGS. 16A and 16B are a graph and a timing diagram illustrating an operation of an electronic circuit of FIG. 14. For convenience of description, FIGS. 16A and 16B will be described with reference to FIG. 14.

Referring to FIG. 16A, the ramp signal generator 210 may generate the first to third ramp signals Vab, VSH, and VSL.

At point in time T1 (e.g., at a point in time when the ABIST enable signal ABIST_EN transitions from logic low to logic high), the first to third ramp signals Vab, VSH, and VSL may increase with an uniform slope. Herein, the slopes of the first to third ramp signals Vab, VSH, and VSL may be different. The reference voltage VREF that is maintained at a uniform level may be input to the first to third comparators COMP1, COMP2, and COMP3.

At point in time TWS, the voltage level of the second ramp signal VSH may be equal to the voltage level of the reference voltage VREF. Accordingly, the second comparator COMP2 may output a signal (i.e., the first comparison voltage V1) whose logical value is changed (e.g., to logic high) at point in time TWS. As in the above description, at point in time TWE, the voltage level of the third ramp signal VSL may be equal to the voltage level of the reference voltage VREF. Accordingly, the third comparator COMP3 may output a signal (i.e., the second comparison voltage V2) whose logical value is changed (e.g., to logic low) at point in time TWE.

At point in time T2, the voltage level of the first ramp signal Vab may be equal to the voltage level of the reference voltage VREF. Accordingly, the first comparator COMP1 may output a signal (i.e., the comparator output COUT) whose logical value is changed (e.g., to logic high) at point in time T2. Because the point in time T2 is between the point in time TWS and the point in time TWE (i.e., within a time window), it may be determined that the first comparator COMP1 operates normally.

At point in time T3 (e.g., at a point in time when the ABIST enable signal ABIST_EN transitions from logic high to logic low), the first to third ramp signals Vab, VSH, and VSL may be reset. For example, the voltage levels of the first to third ramp signals Vab, VSH, and VSL may be reset to the voltage levels at point in time T1.

Referring to FIG. 16B, at point in time T1, the ABIST enable signal ABIST_EN may transition from logic low to logic high. In response to the rising edge of the ABIST enable signal ABIST_EN, the inverted version of the selection signal SEL may transition from logic low to logic high, and the selection signal SEL may transition from logic high to logic low.

At point in time TWS, the first comparison voltage V1 that is a result of comparing the second ramp signal VSH and the reference voltage VREF may transition from logic low to logic high. In this case, because the second comparison voltage V2 that is a result of comparing the third ramp signal VSL and the reference voltage VREF is at logic high, the time window signal VTW that the AND gate G1 outputs may transition from logic low to logic high.

At point in time TWE, the second comparison voltage V2 may transition from logic high to logic low. In this case, because the first comparison voltage V1 is at logic high, the time window signal VTW that the AND gate G1 outputs may transition from logic high to logic low. That is, the time window signal VTW may be at logic high between the point in time TWS and the point in time TWE.

At point in time T2, the comparator output COUT may transition from logic low to logic high. Because the rising edge of the comparator output COUT is present in the logical high period of the time window signal VTW, the logic controller 220 may transfer the ABIST output ABIST_O indicating the normal operation of the first comparator COMP1 to the upper system.

Although not illustrated, unlike FIGS. 16A and 16B, the rising edge of the comparator output COUT (i.e., point in time T2) may not be present in the logical high period of the time window signal VTW. In this case, the logic controller 220 may transfer the ABIST output ABIST_O indicating the abnormal operation of the first comparator COMP1 to the upper system.

Figure 17:
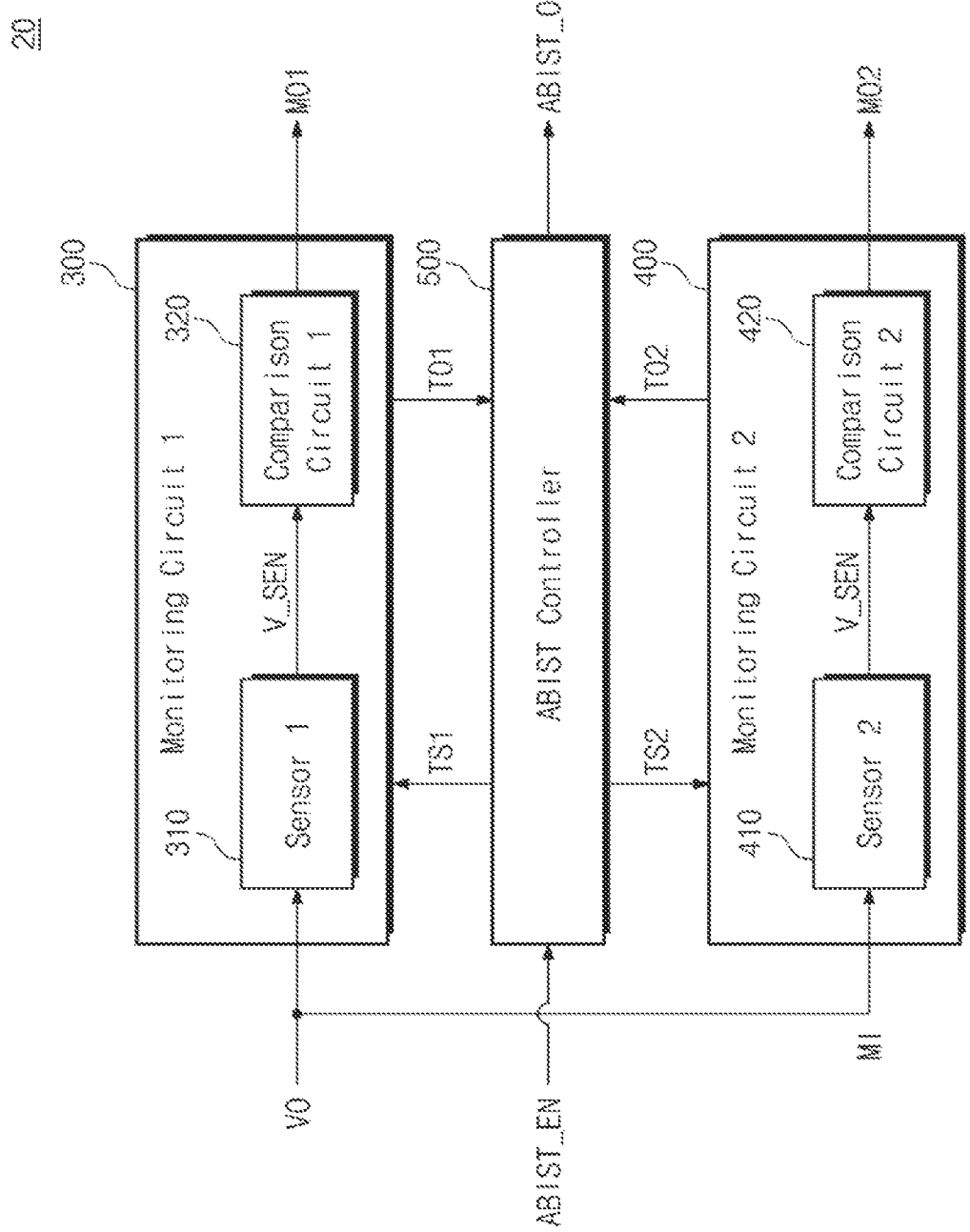
FIG. 17 is a conceptual diagram illustrating an electronic circuit, according to an embodiment.

FIG. 17 is a conceptual diagram illustrating an electronic circuit according to an embodiment. An electronic circuit 20 according to an embodiment may include a first monitoring circuit 300, a second monitoring circuit 400, and an ABIST controller 500. Functions and operations of the first and second monitoring circuits 300 and 400 are similar to those of the monitoring circuit 100 (refer to FIG. 1), and thus, repeated description will be omitted for conciseness and to avoid redundancy. Likewise, a function and an operation of the ABIST controller 500 are similar to those of the ABIST controller 200 (refer to FIG. 1), and thus, repeated description will be omitted for conciseness and to avoid redundancy.

The electronic circuit 20 may perform the ABIST for internally determining whether the first monitoring circuit 300 and the second monitoring circuit 400 operate normally. For example, in the case where the first monitoring circuit 300 and/or the second monitoring circuit 400 does not operate normally due to an internal fault (e.g., a short circuit of an internal circuit, degradation of circuit elements, and/or an event that a comparator exceeds an operating range), the electronic circuit 20 may transfer, to the upper system, a fault signal (e.g., the ABIST output (ABIST_O)) indicating that the first monitoring circuit 300 and/or the second monitoring circuit 400 does not operate normally. Although not illustrated, according to an embodiment, in some embodiments, the electronic circuit 20 may further include an additional monitoring circuit in addition to the first monitoring circuit 300 and the second monitoring circuit 400, and may perform the ABIST on the additional monitoring circuit.

Each of the first monitoring circuit 300 and the second monitoring circuit 400 may operate in the first mode or the second mode. For example, the first mode may be a mode in which the ABIST is not performed, and the second mode may be a mode in which the ABIST is performed. For example, the first monitoring circuit 300 may operate in the first mode. In this case, the second monitoring circuit 400 may operate in the second mode. For example, in the case of performing the ABIST on the first monitoring circuit 300 (i.e., in the case where the first monitoring circuit 300 operates in the second mode), the first monitoring circuit 300 may generate a first test output TO1 based on a first test signal TS1. In this case, the second monitoring circuit 400 may monitor an external control unit (i.e., may operate in the first mode) and may generate a second monitoring output MO2 based on the external output voltage VO. In contrast, the first monitoring circuit 300 may operate in the second mode. In this case, the second monitoring circuit 400 may operate in the first mode.

Since the electronic circuit 20 includes a plurality of monitoring circuits 300 and 400, while performing the ABIST, the electronic circuit 20 may simultaneously determine whether the external control unit operates normally. Accordingly, even while the ABIST is performed, the electronic circuit 20 may not stop monitoring the external control unit.

According to an embodiment, a detailed configuration and a detailed operation of each of the first monitoring circuit 300 and the second monitoring circuit 400 may be similar to those of the monitoring circuit 100 illustrated in FIGS. 1 to 3, 6, 13, and 14. The configuration and operation of the first monitoring circuit 300 may be the same as or different from the configuration and operation of the second monitoring circuit 400.

The ABIST controller 500 may operate in response to the ABIST enable signal ABIST_EN. The ABIST controller 500 may allow (or control) each of the first monitoring circuit 300 and the second monitoring circuit 400 to operate in the first mode or the second mode. The ABIST controller 500 may generate the ABIST output ABIST_O based on the first test output TO1 or the second test output TO2. According to an embodiment, a configuration and an operation of the ABIST controller 500 may be similar to those of the ABIST controller 200 illustrated in FIGS. 1 to 3, 6, 13, and 14.

Figure 18:
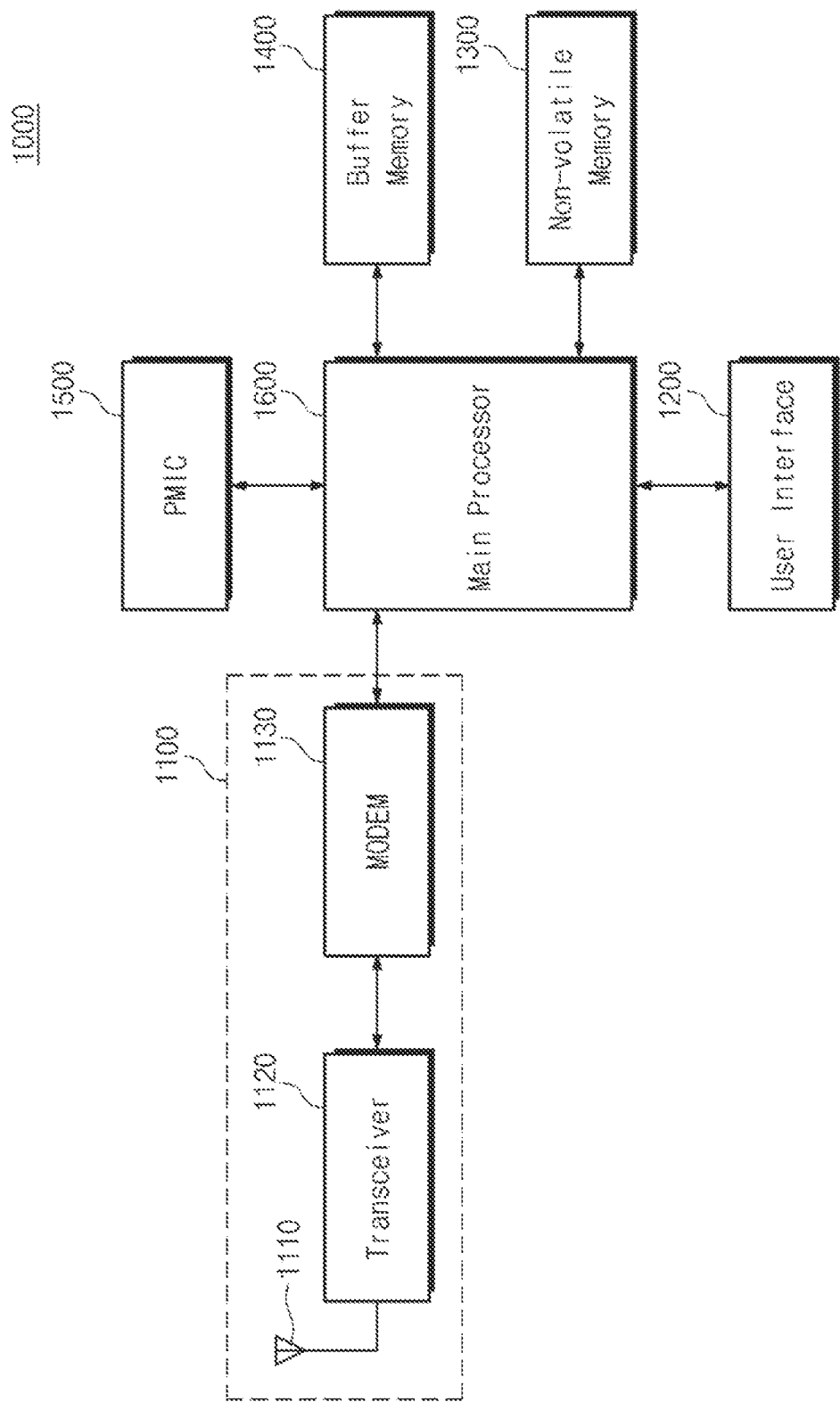
FIG. 18 is a block diagram illustrating a configuration of an electronic device including an electronic circuit, according to an embodiment.

FIG. 18 is a block diagram illustrating a configuration of an electronic device including an electronic circuit according to an embodiment.

Referring to FIG. 18, an electronic device 1000 may include a communication block 1100, a user interface 1200, a non-volatile memory 1300, a buffer memory 1400, a power management integrated circuit (PMIC) 1500, and a main processor 1600. However, the components of the electronic device 1000 are not limited to the embodiment of FIG. 18. The electronic device 1000 may omit one or more of the components illustrated in FIG. 18 or may further include at least one component not illustrated in FIG. 18. In an embodiment, the electronic device 1000 may be implemented with one semiconductor chip, one semiconductor die, one semiconductor package, or one semiconductor module.

The communication block 1100 may include an antenna 1110, a transceiver 1120, and a modulator/demodulator (MODEM) 1130. The communication block 1100 may exchange signals with an external device/system through the antenna 1110. The MODEM 1130 may convert a signal received through the antenna 1110. For example, the transceiver 1120 and the MODEM 1130 of the communication block 1100 may process signals, which are exchanged with the external device/system, in compliance with one or more wireless communication protocols.

The user interface 1200 may arbitrate communication between the user and the electronic device 1000. The user may input commands to the electronic device 1000 through the user interface 1200. The electronic device 1000 may provide the user with information generated by the main processor 1600 through the user interface 1200.

The non-volatile memory 1300 may store data regardless of whether a power is supplied. For example, the non-volatile memory 1300 may include at least one of various nonvolatile memories such as a flash memory, a PRAM, an MRAM, a ReRAM, and/or a FRAM. For example, the non-volatile memory 1300 may include a removable memory such as a hard disk drive (HDD), a solid state drive (SSD), or a secure digital (SD) card, and/or an embedded memory such as an embedded multimedia card (eMMC).

The buffer memory 1400 may store data that are used for an operation of the electronic device 1000. For example, the buffer memory 1400 may temporarily store data processed or to be processed by the main processor 1600. For example, the buffer memory 1400 may include a volatile memory, such as a static random access memory (SRAM), a dynamic RAM (DRAM), or a synchronous DRAM (SDRAM), and/or a nonvolatile memory, such as a flash memory, a phase-change RAM (PRAM), a magneto-resistive RAM (MRAM), a resistive RAM (ReRAM), or a ferro-electric RAM (FRAM).

The PMIC 1500 may power the components of the electronic device 1000. The PMIC 1500 may appropriately convert a power received from a battery and/or an external power source and may transfer the converted power to the components of the electronic device 1000. According to an embodiment, the PMIC 1500 may include at least one of the electronic circuit 10 of FIGS. 1 to 3, 6, 13, and 14 and the electronic circuit 20 of FIG. 17. The electronic circuit 10 or 20 may monitor the voltage converted by the PMIC 1500. The electronic circuit 10 or 20 may perform the ABIST.

The main processor 1600 may control an overall operation of the electronic device 1000. The main processor 1600 may control/manage operations of the components of the electronic device 1000. The main processor 1600 may perform various operations for the purpose of operating the electronic device 1000. For example, the main processor 1600 may be implemented with a microcontroller unit (MCU), a general-purpose processor, a special-purpose processor, and/or an application processor. According to an embodiment, the main processor 1600 may include at least one of the electronic circuit 10 of FIGS. 1 to 3, 6, 13, and 14 and the electronic circuit 20 of FIG. 17. The electronic circuit 10 or 20 may monitor an internal voltage of the main processor 1600. The electronic circuit 10 or 20 may perform the ABIST.

An electronic circuit according to an embodiment may be applied to various electronic devices in various manners. For example, the electronic circuit may be included in each of various electronic devices or may be implemented with a hardware component independent of various electronic devices. However, the present disclosure is not limited thereto.

Figure 19:
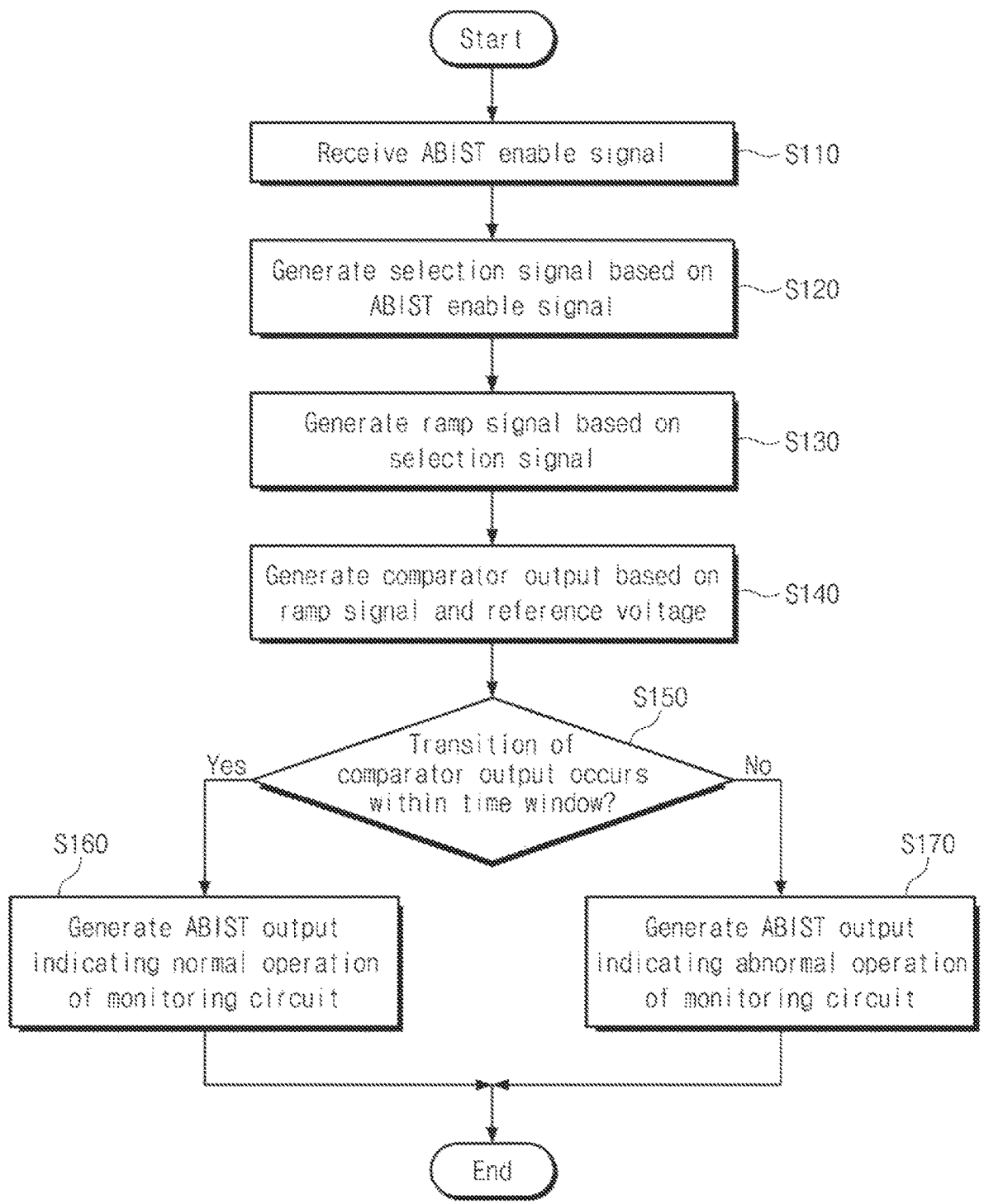
FIG. 19 is a flowchart illustrating an operation of an electronic circuit, according to an embodiment.

FIG. 19 is a flowchart illustrating an operation of an electronic circuit according to an embodiment. For convenience of description, FIG. 19 will be described with reference to FIGS. 4, 6, 11, and 14.

In operation S110, the logic controller 220 may receive the ABIST enable signal ABIST_EN of logic high. Unlike the above description, when the logic controller 220 receives the ABIST enable signal ABIST_EN of logic low, the monitoring circuit 100 may monitor the external output voltage VO.

In operation S120, the logic controller 220 may generate a selection signal (e.g., SEL, SEL1 or SEL2) based on the ABIST enable signal ABIST_EN of logic high. The generated selection signal may be transferred to the ramp signal generator 210 and the monitoring circuit 100. According to an embodiment, the monitoring circuit 100 may stop the monitoring of the external output voltage VO based on the selection signal.

In operation S130, the ramp signal generator 210 may generate the first ramp signal Vab based on the selection signal. For example, the first ramp signal Vab may be a rising ramp signal. According to an embodiment, the ramp signal generator 210 may generate the second ramp signal VSH and the third ramp signal VSL. For example, the second ramp signal VSH and the third ramp signal VSL may be rising ramp signals or falling ramp signals. For example, the ramp signal generator 210 may generate the first to third ramp signals Vab, VSH, and VSL through the charging/discharging of capacitors (e.g., C1, C2, and C3).

In operation S140, the first comparator COMP1 may generate the comparator output COUT based on the first ramp signal Vab and a reference voltage. According to an embodiment, the reference voltage may be the sensing voltage V_SEN (refer to FIG. 3) or the reference voltage VREF (refer to FIG. 14).

In operation S150, the logic controller 220 may determine whether the comparator output COUT transitions within a time window. For example, the transition of the comparator output COUT may be a rising transition (e.g., a low-to-high transition). According to an embodiment, the time window may be determined through operations of the oscillator 230 and the counter logic 221. According to an embodiment, the time window may be determined through the slope of the second ramp signal VSH and the slope of the third ramp signal VSL.

When it is determined that the transition of the comparator output COUT is present within the time window (operation S150, Yes), the logic controller 220 may generate the ABIST output ABIST_O indicating the normal operation of the monitoring circuit 100 in operation S160. In contrast, when it is determined that the transition of the comparator output COUT is not present within the time window (operation S150, No), the logic controller 220 may generate the ABIST output ABIST_O indicating the abnormal operation of the monitoring circuit 100 in operation S170.

According to various embodiments, because it is possible to integrate an electronic circuit in a simple structure, the ABIST may be efficiently performed in terms of a power and an area. According to an embodiment, the electronic circuit may perform the ABIST with an infinite resolution.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An electronic circuit comprising:
a ramp signal generator configured to generate a first ramp signal;
an oscillator configured to generate a clock signal;
a first monitoring circuit configured to operate in an operation mode selected from a first mode of monitoring an external output voltage and a second mode of performing an analog built-in self-test (ABIST), and to generate a comparator output; and
a logic controller configured to control the first monitoring circuit to operate in the operation mode,
wherein, when the first monitoring circuit operates in the second mode, the logic controller counts the clock signal, controls the first monitoring circuit to perform the ABIST based on the first ramp signal, and generates an ABIST output indicating whether the first monitoring circuit operates normally based on a value of the counting and the comparator output.

2. The electronic circuit of claim 1, wherein the first monitoring circuit includes:
a sensor configured to output a sensing voltage based on the external output voltage or a test voltage; and
a comparison circuit configured to generate the comparator output by comparing the sensing voltage and a reference voltage in the first mode and by comparing the sensing voltage and the first ramp signal in the second mode.

3. The electronic circuit of claim 2, wherein the sensor includes:
a test current bias connected with a power supply voltage terminal;
a first switch connected between the test current bias and a first node, and configured to be turned on in the second mode;
a second switch connected between an external voltage input pin and the first node, and configured to be turned on in the first mode;
a first resistor connected between the first node and a voltage division node; and
a second resistor connected between the voltage division node and a ground voltage terminal,
wherein the comparison circuit includes:
a third switch connected between a reference voltage pin and a second node, and configured to be turned on in the first mode;
a fourth switch connected between the ramp signal generator and the second node, and configured to be turned on in the second mode;
a first comparator including a negative input terminal to which the sensing voltage is input, a positive input terminal to which the reference voltage or the first ramp signal is input according to the operation mode, and an output terminal from which the comparator output is output,
wherein the sensor outputs the sensing voltage based on the test voltage in the second mode and outputs the sensing voltage based on the external output voltage in the first mode,
wherein, in the first mode, the reference voltage is input to the positive input terminal of the first comparator, and
wherein, in the second mode, the first ramp signal is input to the positive input terminal of the first comparator.

4. The electronic circuit of claim 3, wherein the logic controller generates a first selection signal and a second selection signal based on an ABIST enable signal,
wherein logical values of the first selection signal and the second selection signal are complementary,
wherein the first switch is turned on or turned off in response to the first selection signal,
wherein the second switch is turned on or turned off in response to the second selection signal,
wherein the third switch is turned on or turned off in response to the second selection signal, and
wherein the fourth switch is turned on or turned off in response to the first selection signal.

5. The electronic circuit of claim 1, wherein the ramp signal generator includes:
a first ramp switch configured to be turned on in the second mode;
a first capacitor connected between a first ramp node and a ground voltage terminal, charges being charged/discharged in the first capacitor as the first ramp switch is turned on/off; and
a first ramp current bias connected between the first ramp node and a power supply voltage terminal.

6. The electronic circuit of claim 1, wherein the logic controller includes:
a logic counter configured to count the clock signal every clock period and to generate a binary code based on a result of the counting.

7. The electronic circuit of claim 6, wherein a time window is set based on the binary code,
wherein, when a logical value of the comparator output transitions within the time window that is set, the logic controller generates the ABIST output indicating a normal operation of the first monitoring circuit, and
wherein, when the logical value of the comparator output does not transition within the time window that is set, the logic controller generates the ABIST output indicating an abnormal operation of the first monitoring circuit.

8. The electronic circuit of claim 1, further comprising:
a second monitoring circuit configured to perform the ABIST based on the first ramp signal when the first monitoring circuit operates in the first mode, and to monitor the external output voltage when the first monitoring circuit operates in the second mode.

9. An electronic circuit comprising:
a ramp signal generator configured to generate a first ramp signal, a second ramp signal, and a third ramp signal;
a first monitoring circuit configured to operate in an operation mode selected from a first mode of monitoring an external output voltage and a second mode of performing an analog built-in self-test (ABIST); and
an ABIST controller configured to perform the ABIST on the first monitoring circuit, based on the first ramp signal,
wherein the first monitoring circuit includes:
a sensor configured to detect the external output voltage; and
a first comparator configured to generate a comparator output, and
wherein the ABIST controller includes:
a second comparator configured to generate a first comparison voltage based on the second ramp signal;
a third comparator configured to generate a second comparison voltage based on the third ramp signal;
an AND gate configured to output a time window signal based on the first comparison voltage and the second comparison voltage; and
a logic controller configured to control the first monitoring circuit to operate in the operation mode and, when the first monitoring circuit is controlled to operation in the second mode, to generate an ABIST output indicating whether the first monitoring circuit operates normally based on the time window signal and the comparator output of the first comparator.

10. The electronic circuit of claim 9, wherein the sensor includes:
a test current bias connected with a power supply voltage terminal;
a first switch connected between the test current bias and a first node, and configured to be turned on in the second mode;
a second switch connected between an external voltage input pin and the first node, and configured to be turned on in the first mode;
a first resistor connected between the first node and a voltage division node; and
a second resistor connected between the voltage division node and a ground voltage terminal,
wherein the sensor outputs a first sensing voltage based on a test voltage, which is formed by the test current bias, in the second mode, and outputs a second sensing voltage based on the external output voltage in the first mode,
wherein the second ramp signal is input to a negative input terminal of the second comparator, and the first sensing voltage is applied to a positive input terminal of the second comparator, and
wherein the third ramp signal is input to a positive input terminal of the third comparator, and the first sensing voltage is applied to a negative input terminal of the third comparator.

11. The electronic circuit of claim 10, further comprising:
a third switch connected between a reference voltage pin and a second node, and configured to be turned on in the first mode; and
a fourth switch connected between the ramp signal generator and the second node, and configured to be turned on in the second mode,
wherein the first sensing voltage or the second sensing voltage is input to a negative input terminal of the first comparator based on the operation mode, a reference voltage or the first ramp signal is input to a positive input terminal of the first comparator, and the comparator output is output from an output terminal of the first comparator,
wherein, in the first mode, the reference voltage is input to the positive input terminal of the first comparator, and
wherein, in the second mode, the first ramp signal is input to the positive input terminal of the first comparator.

12. The electronic circuit of claim 9, wherein the first ramp signal is a rising ramp signal, and
wherein the second ramp signal and the third ramp signal are falling ramp signals.

13. The electronic circuit of claim 12, wherein the ramp signal generator includes:
a first ramp switch configured to be turned on in the second mode;
a first capacitor connected between a first ramp node and a ground voltage terminal, charges being charged/discharged in the first capacitor as the first ramp switch is turned on/off;
a first ramp current bias connected between the first ramp node and a power supply voltage terminal;
a voltage pre-charger configured to charge a second ramp node and a third ramp node before the first monitoring circuit operates in the second mode;
a second capacitor connected between the second ramp node and the power supply voltage terminal, charges being charged/discharged in the second capacitor depending on whether the first monitoring circuit operates in the second mode;
a second ramp current bias connected between the second ramp node and the ground voltage terminal;
a third capacitor connected between the third ramp node and the power supply voltage terminal, charges being charged/discharged in the third capacitor depending on whether the first monitoring circuit operates in the second mode; and
a third ramp current bias connected between the third ramp node and the ground voltage terminal.

14. The electronic circuit of claim 9, wherein the first ramp signal, the second ramp signal, and the third ramp signal are rising ramp signals.

15. The electronic circuit of claim 14, wherein the ramp signal generator includes:
a first ramp switch, a second ramp switch, and a third ramp switch configured to be turned on in the second mode;
a first capacitor connected between a first ramp node and a ground voltage terminal, charges being charged/discharged in the first capacitor as the first ramp switch is turned on/off;
a first ramp current bias connected between the first ramp node and a power supply voltage terminal;
a second capacitor connected between a second ramp node and the ground voltage terminal, charges being charged/discharged in the second capacitor as the second ramp switch is turned on/off;
a second ramp current bias connected between the second ramp node and the power supply voltage terminal;

a third capacitor connected between a third ramp node and the ground voltage terminal, charges being charged/discharged in the third capacitor as the third ramp switch is turned on/off; and a third ramp current bias connected between the third ramp node and the power supply voltage terminal.

16. The electronic circuit of claim 14, further comprising:

a first switch configured to be turned on in the second mode; and a second switch configured to be turned on in the first mode, wherein the sensor generates a sensing voltage based on the external output voltage in the first mode, wherein a reference voltage is applied to a negative input terminal of the first comparator, wherein, in the second mode, the sensing voltage is applied to a positive input terminal of the first comparator, wherein, in the first mode, the first ramp signal is applied to the positive input terminal of the first comparator, wherein the reference voltage is input to a negative input terminal of the second comparator, and the second ramp signal is applied to a positive input terminal of the second comparator, and wherein the third ramp signal is input to a negative input terminal of the third comparator, and the reference voltage is applied to a positive input terminal of the third comparator.

17. The electronic circuit of claim 9, wherein the logic controller includes:

a pulse generator configured to generate a pulse signal based on an ABIST enable signal;

a first flip-flop configured to latch a first logical value of a power supply voltage at an edge of the comparator output, to output an intermediate detection signal having the latched first logical value, and to be reset by an inverted version of the time window signal;

a second flip-flop configured to latch a second logical value of the power supply voltage at an edge of the intermediate detection signal, to output an intermediate output signal having the latched second logical value, and to be reset by an inverted version of the pulse signal; and a third flip-flop configured to latch a third logical value of the intermediate output signal at an edge of an inverted version of the ABIST enable signal, to output a power good signal having the latched third logical value, and to be reset by an inverted version of a system reset signal, wherein the ABIST output is based on the power good signal.

18. The electronic circuit of claim 9, further comprising:

a second monitoring circuit configured to perform the ABIST based on the first ramp signal when the first monitoring circuit operates in the first mode and to monitor the external output voltage when the first monitoring circuit operates in the second mode.

19. An operating method of an electronic circuit, the method comprising:

receiving an analog built-in self-test (ABIST) enable signal;

generating a selection signal based on the ABIST enable signal;

generating at least one ramp signal based on the selection signal;

generating a comparator output based on a reference voltage and the at least one ramp signal;

determining whether a logical value of the comparator output transitions within a time window determined by the at least one ramp signal;

generating an ABIST output indicating a normal operation of a monitoring circuit when the logical value of the comparator output transitions within the time window; and generating the ABIST output indicating an abnormal operation of the monitoring circuit when the logical value of the comparator output does not transition within the time window.

20. The method of claim 19, wherein the at least one ramp signal comprises a first ramp signal, and second ramp signal and a third ramp signal, the first ramp signal is a rising ramp signal, and the second ramp signal and the third ramp signal are rising ramp signals or falling ramp signals.

* * * * *